US012615951B2

(12) United States Patent
Lee et al.

(10) Patent No.: US 12,615,951 B2
(45) Date of Patent: Apr. 28, 2026

(54) ELECTRONIC APPARATUS AND METHOD OF MANUFACTURING FOR THE SAME

(71) Applicant: Samsung Display Co., Ltd., Yongin-Si (KR)

(72) Inventors: Changmoo Lee, Yongin-si (KR); Youngdo Kim, Yongin-si (KR); Junehyoung Park, Yongin-si (KR); Junwoo You, Yongin-si (KR); Suk Won Jung, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 320 days.

(21) Appl. No.: 18/201,898

(22) Filed: May 25, 2023

(65) Prior Publication Data
US 2024/0074297 A1     Feb. 29, 2024

(30) Foreign Application Priority Data

Aug. 25, 2022     (KR) ........................ 10-2022-0106672

(51) Int. Cl.
*H10K 59/80* (2023.01)

(52) U.S. Cl.
CPC ............................... *H10K 59/8794* (2023.02)

(58) Field of Classification Search
CPC .. H10K 59/8794; H10K 50/87; H10K 50/844; H10K 50/86; H10K 59/00; H10K 71/00; H10K 77/111; H05K 7/20963
See application file for complete search history.

(56) References Cited

U.S. PATENT DOCUMENTS

| | | | |
|---|---|---|---|
| 9,625,784 B2 | 4/2017 | Joo | |
| 2012/0276403 A1 | 11/2012 | Nakagawa et al. | |
| 2017/0194596 A1* | 7/2017 | Shen | H10K 59/8722 |
| 2020/0233469 A1* | 7/2020 | Won | G06F 1/1626 |
| 2020/0373513 A1* | 11/2020 | Kim | H05K 7/20963 |
| 2021/0202853 A1* | 7/2021 | An | H10K 77/111 |
| 2021/0257587 A1* | 8/2021 | Qin | H10K 59/873 |

FOREIGN PATENT DOCUMENTS

| | | | | |
|---|---|---|---|---|
| CN | 102753735 A | 10/2012 | | |
| CN | 106992262 A | 7/2017 | | |
| KR | 10-2010-0091140 | 8/2010 | | |
| KR | 10-1740606 | 5/2017 | | |
| KR | 20190009203 A | * | 1/2019 | ............. H01J 17/28 |
| KR | 10-2020-0034690 A | 3/2020 | | |
| KR | 10-2085696 | 3/2020 | | |

OTHER PUBLICATIONS

Oh, Cho Hee; Kim, Ji Hyun; Jeong, Min Woo; Kim, Se Hyeon, "Display Device", Jan. 28, 2019, LG Electronics Inc., Entire Document (Translation of KR 20190009203). (Year: 2019).*

* cited by examiner

*Primary Examiner* — Stephen S Sul
(74) *Attorney, Agent, or Firm* — F. CHAU & ASSOCIATES, LLC

(57) ABSTRACT

An electronic apparatus include a display panel having a rear surface. A heat dissipation layer is disposed on the rear surface of the display panel. The heat dissipation layer includes a base portion including a first surface facing the rear surface and a second surface opposite to the first surface. Conductive particles are dispersed in the base portion. The conductive particles may be spaced apart from the first surface. A density of a distribution of the conductive particles increases from the first surface to the second surface.

15 Claims, 16 Drawing Sheets

FIG. 5B

ELECTRONIC APPARATUS AND METHOD OF MANUFACTURING FOR THE SAME

CROSS-REFERENCE TO RELATED APPLICATIONS

This application claims priority under 35 U.S.C. § 119 to Korean Patent Application No. 10-2022-0106672, filed on Aug. 25, 2022 in the Korean Intellectual Property Office, the disclosure of which is incorporated by reference in its entirety herein.

1. Technical Field

The present inventive concept relates to an electronic apparatus including a heat dissipation layer and a method for manufacturing the same.

2. Discussion of Related Art

Various multimedia electronic apparatuses, such as a television, a mobile phone, a tablet, a navigation device, and a game machine, may include a display device for displaying an image and electronic components performing various functions. As the performance and thinness of electronic apparatuses have increased, the electronic components embedded therein have been made to have an increasingly large capacity and a high level of integration. Accordingly, the electronic components generate a relatively large amount of heat inside the electronic apparatus. The heat generated in the electronic apparatus shortens lifespan of a product or causes failures and malfunctions of the electronic components and display device.

SUMMARY

An object of the present inventive concept is to provide an electronic apparatus having a reduced thickness and increased heat dissipation, and a method for manufacturing the same.

According to an embodiment of the present inventive concept, an electronic apparatus include a display panel having a rear surface. A heat dissipation layer is disposed on the rear surface of the display panel. The heat dissipation layer includes a base portion including a first surface facing the rear surface and a second surface opposite to the first surface. Conductive particles are dispersed in the base portion. The conductive particles may be spaced apart from the first surface. A density of a distribution of the conductive particles increases from the first surface to the second surface.

In an embodiment, the first surface of the base portion may directly contact the rear surface of the display panel.

In an embodiment, the display panel may include a base substrate defining the rear surface of the display panel and light emitting elements disposed on the base substrate. The heat dissipation layer may directly contact the base substrate.

In an embodiment, a conductivity of the heat dissipation layer on the second surface may be greater than a conductivity of the heat dissipation layer on the first surface.

In an embodiment, the base portion may include a polymer resin.

In an embodiment, each of the conductive particles may include a metal material.

In an embodiment, the electronic apparatus may further include a flexible circuit board electrically connected to the display panel and disposed under the second surface of the base portion.

In an embodiment, the electronic apparatus may further include an electronic module disposed under the second surface of the base portion.

In an embodiment, the electronic apparatus may further include a window disposed on the display panel.

In an embodiment, the electronic apparatus may further include a sensor layer disposed between the display panel and the window.

According to an embodiment of the present inventive concept, an electronic apparatus includes a display panel having a rear surface. A heat dissipation layer is disposed on the rear surface of the display panel. The heat dissipation layer includes a base portion including an upper portion directly contacting the rear surface of the display panel and a lower portion disposed under the upper portion. Conductive particles are spaced apart from the display panel with the upper portion interposed therebetween. The conductive particles are dispersed in the lower portion and are not dispersed in the upper portion. The upper portion and the lower portion include a polymer resin of a same material and are integrally formed.

In an embodiment, a conductivity of a lower portion of the heat dissipation layer that includes the lower portion of the base portion is greater than a conductivity of an upper portion of the heat dissipation layer that includes the upper portion of the base portion.

In an embodiment, the electronic apparatus may further include an electronic module and a power source module disposed under the lower portion of the base portion.

In an embodiment, the conductive particles may include copper and/or silver.

According to an embodiment of the present inventive concept, a method of manufacturing of an electronic includes providing a display module including a display panel. A base resin having conductive particles dispersed therein is coated on a rear surface of the display module to form a preliminary heat dissipation layer. A magnetic field is applied to the preliminary heat dissipation layer. The preliminary heat dissipation layer is cured to form a heat dissipation layer.

In an embodiment, the preliminary heat dissipation layer may include a first surface facing the rear surface of the display module and a second surface opposite to the first surface. The applying of the magnetic field disperses the conductive particles to be positioned adjacent to the second surface and to be spaced apart from the first surface.

In an embodiment, the method may further include pre-curing the preliminary heat dissipation layer before the applying of the magnetic field to form a pre-cured preliminary heat dissipation layer.

In an embodiment, a curing degree of a surface of the pre-cured preliminary heat dissipation layer may be different from a curing degree of an interior of the pre-cured preliminary heat dissipation layer.

In an embodiment, a first light may be irradiated on the preliminary heat dissipation layer for the pre-curing of the preliminary heat dissipation layer. A second light may be irradiated on the pre-cured heat dissipation layer for the curing the pre-cured heat dissipation layer to form the heat dissipation layer. The first light may be different from the second light in intensity and/or irradiation time.

BRIEF DESCRIPTION OF THE DRAWINGS

Embodiments of the present inventive concept will be more clearly understood from the following brief description taken in conjunction with the accompanying drawings. The accompanying drawings represent non-limiting embodiments as described herein.

FIG. 5B is a cross-sectional view of an electronic apparatus according to a comparative embodiment.

DETAILED DESCRIPTION OF EMBODIMENTS

Figure 1:
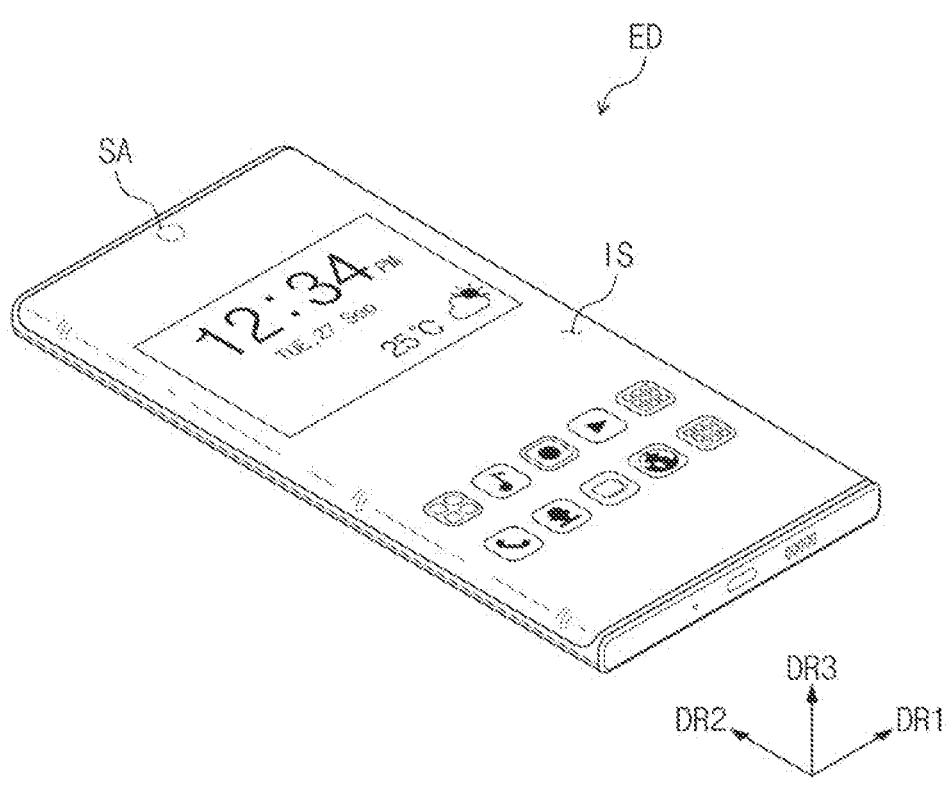
FIG. 1 is a perspective view of an electronic apparatus according to an embodiment of the present inventive concept.

The present inventive concept may apply various changes and different shapes and is, therefore only illustrated in details with respect to some particular examples. However, it should be understood that the present inventive concept is not limited to the described embodiments, but includes all changes, equivalents, or alternatives which are included in the spirit and technical scope of the present inventive concept.

Herein, when a component (or an area, a layer, a part, etc.) is referred to as being "on," "connected to," or "coupled to" another element, it may be directly on, connected to, or coupled to the other component or intervening components may be present. When a component (or an area, a layer, a part, etc.) is referred to as being "directly on," "directly connected to," or "directly coupled to" another element, no intervening components may be present.

Like reference numerals denote like elements. Additionally, in the drawings, thicknesses, proportions, and dimensions of components are exaggerated for effective description of technical content. The term "and/or" includes any and all combinations of one or more of the associated listed items.

It will be understood that, although the terms "first", "second", etc. may be used herein to describe various components, these components should not necessarily be limited by these terms. These terms may only be used to distinguish one component from another component. For example, a first component discussed below may be termed a second component without departing from the teachings of embodiments. The singular forms are intended to include the plural forms as well, unless the context clearly indicates otherwise.

In addition, terms such as "below," "lower," "above," "upper," and the like are used to describe the relationship of the configurations shown in the drawings. The terms are used as a relative concept and are described with reference to the direction indicated in the drawings.

It should be understood that the terms "comprise", or "include" are intended to specify the presence of stated features, integers, steps, operations, elements, components, or combinations thereof in the disclosure, but do not preclude the presence or addition of one or more other features, integers, steps, operations, elements, components, or combinations thereof.

Unless otherwise defined, all terms (including technical and scientific terms) used herein have the same meaning as commonly understood by one of ordinary skill in the relevant art of the present inventive concept. Terms, such as those defined in commonly used dictionaries, should be interpreted as having a meaning that is consistent with their meaning in the context of the relevant art and will not be interpreted in an idealized or overly formal sense, unless expressly so defined herein.

Hereinafter, an electronic apparatus and a manufacturing method thereof according to an embodiment of the present inventive concept will be described with reference to the drawings.

FIG. 1 is a perspective view of an electronic apparatus ED according to an embodiment of the present inventive concept.

Referring to FIG. 1, an electronic apparatus ED may be a device that is activated in response to an electrical signal and displays an image. For example, in an embodiment the electronic apparatus ED may be a large device such as a television, an external billboard, and so forth, or a small or medium-sized device such as a monitor, a mobile phone, a tablet, a navigation device, a game machine, and so forth. However, embodiments of the electronic apparatus ED are not necessarily limited thereto. In an embodiment as shown in FIG. 1, the electronic apparatus ED is shown as a mobile phone for convenience of explanation.

When viewed in a plan, the electronic apparatus ED may have a tetragonal shape having relatively short sides extending in a first direction DR1 and relatively long sides extending in a second direction DR2 intersecting the first direction DR1. However, embodiments of the present inventive concept are not necessarily limited thereto, and the electronic apparatus ED may have various shapes such as a circle and a polygon, in a plan view.

In an embodiment, a third direction DR3 may be defined as a direction perpendicular to a plane defined by the first direction DR1 and the second direction DR2. A front surface (e.g., an upper surface) and a rear surface (e.g., a lower surface) of each member constituting the electronic apparatus ED may be opposite to each other in the third direction DR3, and a normal direction of each of the front surface and the rear surface may be substantially parallel to the third direction DR3. A distance between the front surface and the rear surface defined in the third direction DR3 may correspond to a thickness of the member, such as a thickness of the electronic apparatus ED.

In this specification, "in a plan view" may be defined as a state viewed from the third direction DR3. Herein, "on a cross-section view" may be defined as a state viewed from the first direction DR1 or the second direction DR2. However, embodiments of the present inventive concept are not necessarily limited thereto and the directions indicated by the first to third directions DR1, DR2, and DR3 are relative concepts which may be converted into other directions.

The electronic apparatus ED may be rigid or flexible. A term "flexible" may mean a bendable or foldable characteristics, and may range from a completely folded structure to a structure bendable by several nanometers. For example, the flexible electronic apparatus ED may include a curved device or a foldable device.

The electronic apparatus ED may display an image through a display surface IS. In an embodiment, the display surface IS may correspond to a front surface of the electronic apparatus ED. However, embodiments of the present inventive concept are not necessarily limited thereto. The display surface IS of the electronic apparatus ED may include a plane in which the first direction DR1 and the second direction DR2 are defined, and the image may be displayed in the third direction DR3 intersecting the first and second directions DR1 and DR2. In an embodiment, the display surface IS may further include curved surfaces each bent from at least two sides of the plane. However, embodiments of the present inventive concept are not necessarily limited thereto and a shape of the display surface IS may vary. For example, in some embodiments the display surface IS may include only the plane, or may further include at least two or more, for example, four curved surfaces bent from four sides of the plane.

A portion of the display surface IS may be defined as a sensing area SA. FIG. 1 illustrates one sensing area SA as an example. However, embodiments of the present inventive concept are not necessarily limited thereto and the number of sensing areas SA may vary. The sensing area SA may be a region having a higher light transmittance than other portions within the display surface IS. The sensing area SA may transmit an optical signal and display the image.

The electronic apparatus ED according to an embodiment may sense an external input applied from the outside. The external input may include various types of inputs. For example, the external input may include force, pressure, temperature, light, and so forth. In an embodiment, the external input may include not only an input that is in direct contact with the electronic apparatus ED (e.g., a direct contact by a user's hand or a pen) but also an input that is applied in proximity to the electronic apparatus ED (e.g., hovering).

The electronic apparatus ED may detect a user's input through the display surface IS defined on the front surface and respond to the sensed input signal. However, the region of the electronic apparatus ED sensing the external input is not necessarily limited to the front surface of the electronic apparatus ED, and may be changed depending on a design of the electronic apparatus ED. For example, in some embodiments the electronic apparatus ED may sense the user's input applied to a side surface or a rear surface of the electronic apparatus ED.

Figure 2:
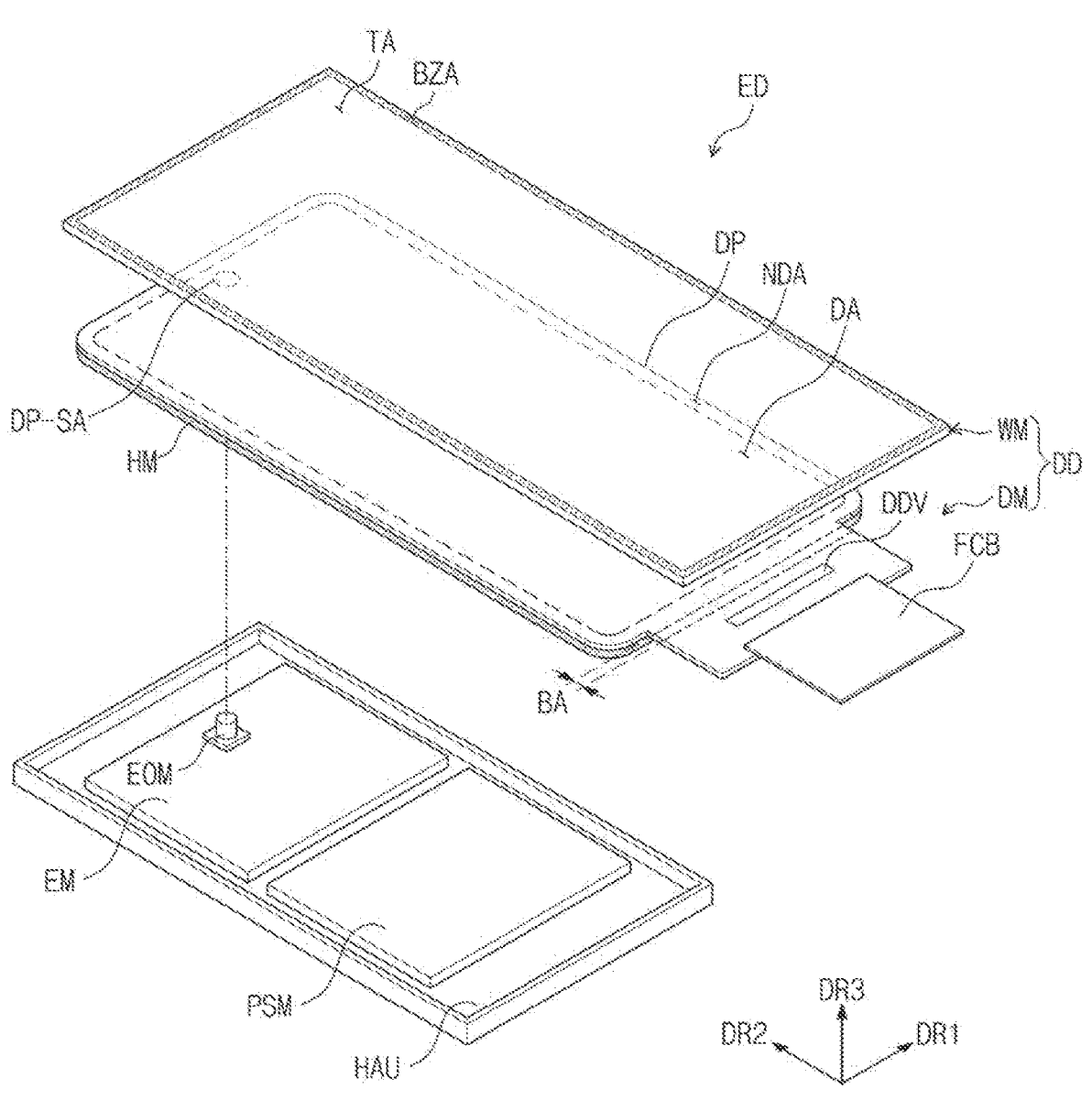
FIG. 2 is an exploded perspective view of an electronic apparatus according to an embodiment of the present inventive concept.
Figure 3:
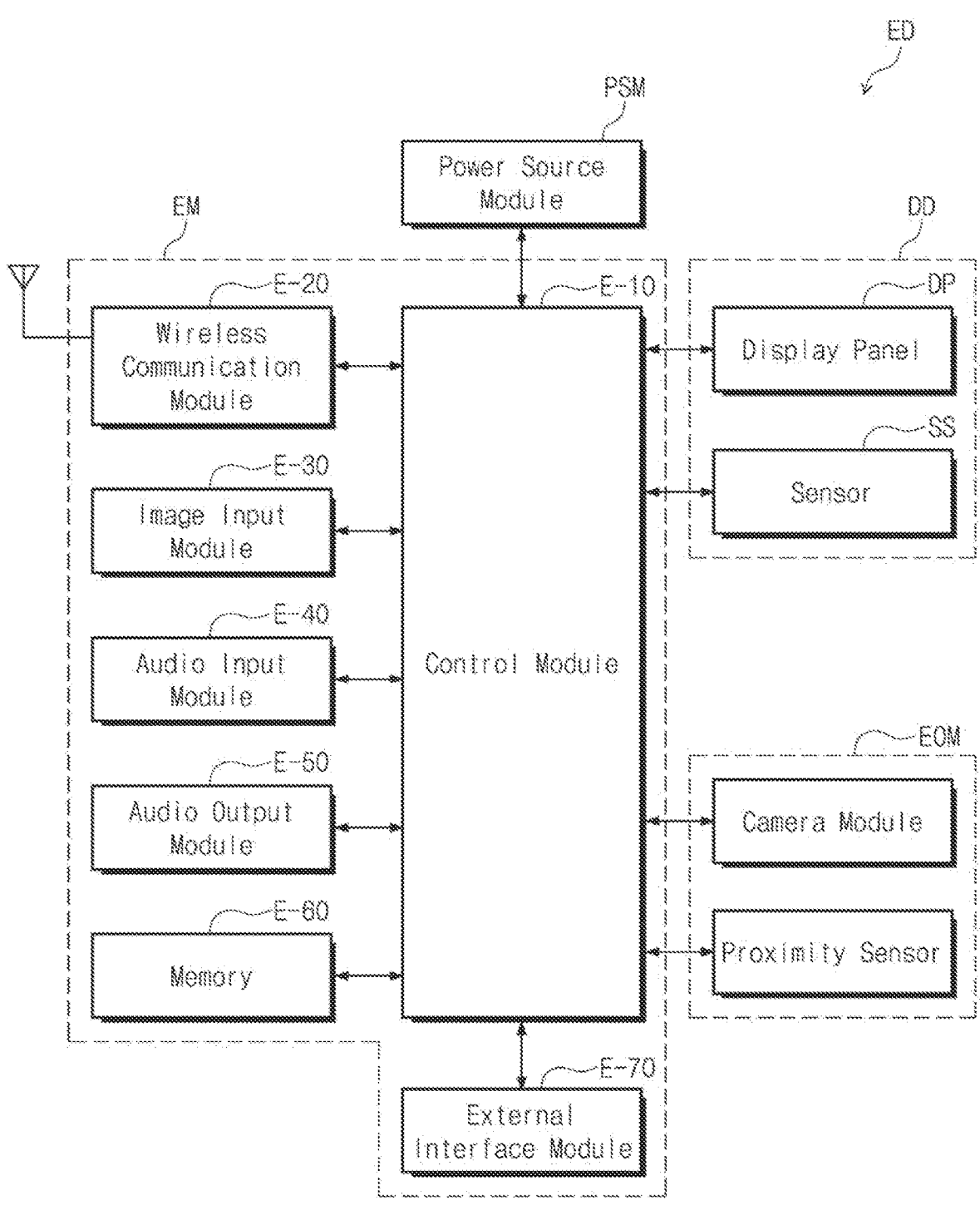
FIG. 3 is a block diagram of an electronic apparatus according to an embodiment of the present inventive concept.

FIG. 2 is an exploded perspective view of an electronic apparatus ED according to an embodiment of the present inventive concept. FIG. 3 is a block diagram of an electronic apparatus ED according to an embodiment of the present inventive concept.

Referring to FIGS. 2 and 3, the electronic apparatus ED may include a display device DD, an electronic module EM, an electro-optical module EOM, a power source module PSM, and a housing HAU.

The display device DD may generate an image and sense an external input. The display device DD may include a window WM and a display module DM. In an embodiment, the display module DM may include at least a display panel DP, and may further include at least one component disposed on the display panel DP. FIG. 2 schematically illustrates only the display panel DP among stacked structures of the display module DM. However, embodiments of the display module DM is not necessarily limited thereto.

The window WM may be disposed on the display module DM. The window WM may cover a front surface of the display module DM, and may protect the display module DM from external impacts and scratches. In an embodiment, the window WM may be coupled to the display module DM through an adhesive layer.

In an embodiment, the window WM may include an optically transparent insulating material. For example, the window WM may include a glass film or a synthetic resin film as a base film. However, embodiments of the present inventive concept are not necessarily limited thereto. The window WM may have a single-layered or multi-layered structure. For example, in an embodiment the window WM may include a plurality of synthetic resin films bonded with an adhesive, or a glass film and a synthetic resin film bonded with an adhesive. The window WM may further include a functional layer such as an anti-fingerprint layer, a phase control layer, and a hard coating layer disposed on the base film.

A front surface of the window WM may correspond to the front surface of the electronic apparatus ED. The front surface of the window WM may include a transmission area TA and a bezel area BZA.

The transmission area TA may be an optically transparent region. The transmissive area TA may transmit an image provided by the display panel DP, and a user may visibly recognize the image through the transmissive area TA. In an embodiment shown in FIG. 2, the transmission area TA is illustrated in a tetragonal shape. However, embodiments of the present inventive concept are not necessarily limited thereto and the transmission area TA may have various shapes.

The bezel area BZA may be adjacent to the transmission area TA (e.g., in the first and/or second directions DR1, DR2). A shape of the transmission area TA may be substantially defined by the bezel area BZA. For example, the bezel area BZA may be disposed outside the transmission area TA to surround the transmission area TA (e.g., in the first and/or second directions DR1, DR2). However, embodiments of the present inventive concept are not necessarily limited thereto, and the bezel area BZA may be adjacent to only one side of the transmission area TA or may be omitted altogether. Also, in some embodiments the bezel area BZA may be disposed on a side surface of the electronic apparatus ED instead of the front surface of the electronic apparatus ED.

The bezel area BZA may be a region having a lower light transmittance than a light transmittance of the transmission area TA. The bezel area BZA may correspond to a region on which a material having a color is printed. The bezel area BZA may prevent light from being transmitted, and thus one configuration of the display module DM disposed to overlap the bezel area BZA may be prevented from being visually recognized from the outside by the user.

The display panel DP may be disposed between the window WM and the housing HAU. The display panel DP may display the image in response to an electrical signal. The display panel DP according to an embodiment may be a light emitting display panel. However, embodiments of the present inventive concept are not necessarily limited thereto. For example, in an embodiment the display panel DP may be an organic light emitting display panel, an inorganic light emitting display panel, or a quantum dot light emitting display panel. An emission layer of the organic light emitting display panel may include an organic light emitting material, and an emission layer of the inorganic light emitting display panel may include an inorganic light emitting material. An emission layer of the quantum dot light emitting display panel may include quantum dots and quantum rods. Hereinafter, the display panel DP will be described as an organic light emitting display panel for convenience of explanation.

The display panel DP may include a display area DA and a non-display area NDA. The display area DA may be a region in which a light emitting element is disposed. The light emitting element may generate light in response to an electrical signal and may output the image through the display area DA. For example, the light emitting element may be a light emitting diode. However, embodiments of the present inventive concept are not necessarily limited thereto. The display area DA may overlap at least a portion of the transmission area TA.

The display panel DP may include a sensing area DP-SA, and may correspond to the sensing area SA of the electronic apparatus ED described above. For example, the sensing area DP-SA may be a region having a relatively high optical signal transmittance among the display area DA. The sensing area DP-SA may be defined in the display area DA. However, embodiments of the present inventive concept are not necessarily limited thereto, and a portion of the sensing area DP-SA may be defined in the non-display area NDA.

A light emitting element may be disposed in the sensing area DP-SA. In an embodiment, a density of the light emitting elements disposed in the sensing area DP-SA may be less than a density of the light emitting elements disposed in the other regions spaced apart from the sensing area DP-SA in the display area DA. For example, the sensing area DP-SA may have a lower resolution than resolutions of other regions of the display area DA.

The non-display area NDA may be adjacent to the display area DA (e.g., in the first and/or second directions DR1, DR2). For example, the non-display area NDA may surround the display area DA (e.g., in the first and/or second directions DR1, DR2). However, embodiments of the present inventive concept are not necessarily limited thereto, and the non-display area NDA may be defined in various shapes. The non-display area NDA may be a region in which a driving circuit for driving the light emitting element disposed in the display area DA, signal lines providing electrical signals to the light emitting element, and pads are disposed. The non-display area NDA may overlap at least a portion of the bezel area BZA, and components disposed in the non-display area NDA may be prevented from being visibly recognized from the outside by the user due to the bezel area BZA.

In an embodiment, the electronic apparatus ED may include a flexible circuit board FCB electrically connected to the display panel DP. The flexible circuit board FCB may be disposed on the non-display area NDA of the display panel DP to be coupled to the display panel DP. The flexible circuit board FCB may be connected to a main circuit board. The main circuit board may be one electronic component constituting the electronic module EM.

In an embodiment, a portion of the non-display area NDA of the display panel DP adjacent to the flexible circuit board FCB may serve as a bending area BA. The bending area BA may be bent about a bending axis parallel to the first direction DR1. Due to the bending of the bending area BA, the flexible circuit board FCB may overlap a portion of the display panel DP in a plan view. However, embodiments of the present inventive concept are not necessarily limited thereto and the electronic device ED may include one or a plurality of bending areas BA that are variously arranged.

The display panel DP may include a data driver DDV disposed in the non-display area NDA. The data driver DDV may include a data driving circuit for driving pixels in the display area DA. In an embodiment, the data driver DDV may be provided in a form of an integrated circuit chip mounted in the non-display area NDA of the display panel DP. However, embodiments of the present inventive concept are not necessarily limited thereto. For example, in an embodiment the data driver DDV may be mounted on the flexible circuit board FCB.

The window WM and the housing HAU may be assembled to each other to configure an exterior of the electronic apparatus ED. The display module DM, the electronic module EM, and the power source module PSM may be accommodated in an internal space formed by assembling the window WM and the housing HAU.

The housing HAU may include a material having a relatively high rigidity. For example, in an embodiment the housing HAU may include a plurality of frames and/or plates made of glass, plastic, metal, or a combination thereof. The housing HAU may absorb an external shock or prevent foreign substances/moisture from penetrating from the outside, thereby protecting components of the electronic apparatus ED accommodated in the housing HAU.

Referring to FIG. 3, the display device DD may include a display panel DP and a sensor SS. The sensor SS may include at least one of an input sensor, an antenna sensor, and a fingerprint sensor.

The electronic module EM may include a control module E-10, a wireless communication module E-20, an image input module E-30, an audio input module E-40, an audio output module E-50, a memory E-60, an external interface module E-70, etc. In an embodiment, the electronic module EM may include a main circuit board, and modules included in the electronic module EM may be mounted on the main circuit board or electrically connected to the main circuit board through a flexible circuit board. The electronic module EM may be electrically connected to the power source module PSM.

The control module E-10 may control the overall operation of the electronic apparatus ED. For example, the control module E-10 may activate or deactivate the display device DD in accordance with a user input. The control module E-10 may control the image input module E-30, the audio input module E-40, the audio output module E-50, and so forth in accordance with the user input. The control module E-10 may include at least one microprocessor.

The wireless communication module E-20 may transmit/receive a wireless signal to/from another terminal, such as by using a Bluetooth or a Wi-Fi line. The wireless communication module E-20 may transmit/receive a voice signal using a general communication line. The wireless communication module E-20 may include a plurality of antenna modules.

The image input module E-30 may process an image signal and convert the image signal into image data displayable on the display device DD. The audio input module E-40 may receive an external audio signal by a microphone in a recording mode, a voice recognition mode, and so forth, and convert the audio signal into electrical voice data. The audio output module E-50 may convert the audio data received from the wireless communication module E-20 or the audio data stored in the memory E-60 and output the audio data to the outside.

In an embodiment, the external interface module E-70 may serve as an interface connected to an external charger, a wired/wireless data port, a card socket (e.g., a memory card, a SIM/UIM card), etc.

The power source module PSM may supply power required for the overall operation of the electronic apparatus ED. For example, the power source module PSM may include a general battery device.

Referring to FIG. 2, the electro-optical module EOM may overlap the sensing area DP-SA and may be disposed under the display panel DP (e.g., in the third direction DR3). The electro-optical module EOM may be an electronic component that receives an optical signal provided from the outside through the sensing area DP-SA or outputs an optical signal to the outside. For example, in an embodiment the electro-optical module EOM may include a camera module and/or a proximity sensor. The camera module may be a module that captures an external image through the sensing area DP-SA. The proximity sensor may be a sensor that measures a distance between an object and the electronic apparatus ED by using information received through the sensing area DP-SA. However, embodiments of the present inventive concept are not necessarily limited thereto and the electro-optical module EOM may vary. For example, in an embodiment, the electro-optical module EOM may further include a sensor for recognizing a part of the user's body (e.g., fingerprint, iris, or face), or a small lamp for outputting light.

Referring to an embodiment shown in FIG. 2, the electronic apparatus ED may include a heat dissipation layer HM disposed on a rear surface of the display panel DP. For example, the heat dissipation layer HM may be directly formed on the rear surface of the display panel DP. For example, the heat dissipation layer HM may be coupled to a configuration defining the rear surface of the display panel DP without a separate adhesive layer. Electronic components such as the electronic module EM, the power source module PSM, the electro-optical module EOM, and the flexible circuit board FCB disposed on the rear surface of the display panel DP may generate heat, and the heat dissipation layer HM may prevent the heat generated from the electronic components from being transferred to the display panel DP.

In an embodiment, the heat dissipation layer HM may be provided integrally. For example, in an embodiment the heat dissipation layer HM may be provided as a single layer, rather than being provided by stacking a plurality of functional layers in the third direction DR3. The integrated heat dissipation layer HM may protect the display panel DP from external impact or interference transmitted toward the rear surface of the display panel DP as well as heat dissipation. For example, the heat dissipation layer HM may serve to absorb shock, block light, block electromagnetic waves, and so forth, in addition to dissipating the heat. The heat dissipation layer HM may shield or absorb electromagnetic waves generated from the electronic components disposed on the rear surface of the display panel DP, thereby preventing the electromagnetic waves from affecting the display panel DP as noise. In addition, the heat dissipation layer HM may block light emitted to the rear surface of the display panel DP, thereby preventing the electronic components disposed on the rear surface of the display panel DP from being visibly recognized or viewed from the outside by the user.

The heat dissipation layer HM may protect the display panel DP from external factors such as heat, shock, and electromagnetic waves transmitted to the display panel DP, thereby increasing reliability of the display panel DP and the electronic apparatus ED. In addition, the heat dissipation layer HM may have a single-layer structure and may be directly formed on the rear surface of the display panel DP, and thus a thickness of the display device DD and the electronic apparatus ED on which the heat dissipation layer HM is disposed may be relatively thin, and the reliability of the display panel DP may be increased. A configuration of the heat dissipation layer HM will be described in detail later with reference to the drawings.

Figure 4:
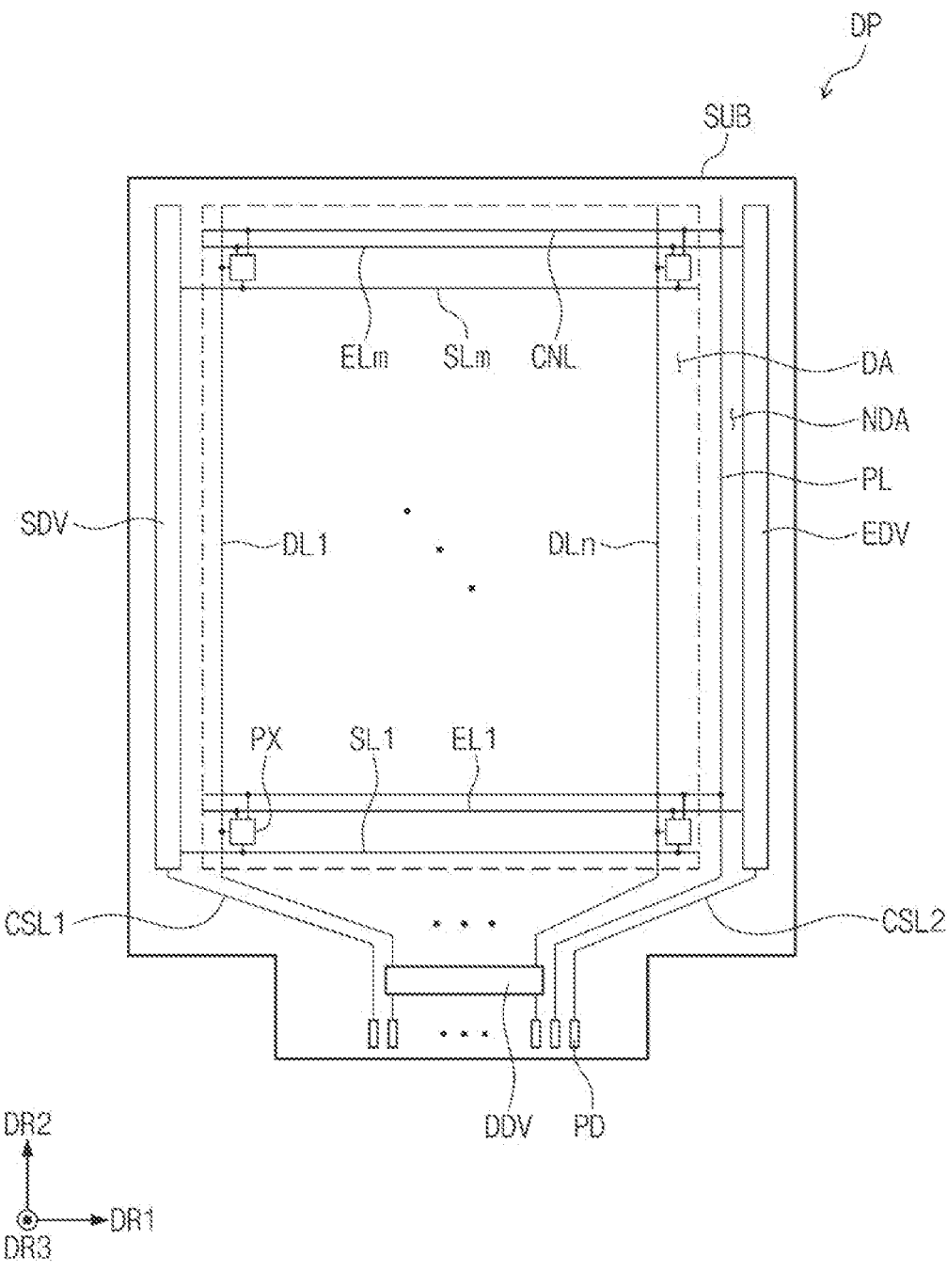
FIG. 4 is a plan view of a display panel according to an embodiment.

FIG. 4 is a plan view of a display panel DP according to an embodiment.

Referring to FIG. 4, the display panel DP may include a base substrate SUB, pixels PX, signal lines SL1 to SLm, DL1 to DLn, EL1 to ELm, CSL1, CSL2, PL, and CNL electrically connected to the pixels PX, a scan driver SDV, a data driver DDV, and an emission driver EDV.

The base substrate SUB may provide a base surface on which elements and wirings of the display panel DP are disposed on a plane parallel to each of first and second directions DR1 and DR2. The base substrate SUB may include a display area DA and a non-display area NDA corresponding to the display area DA and the non-display area NDA of the display panel DP described above.

The pixels PX may be disposed in the display area DA to display an image. The non-display area NDA may be adjacent to the display area DA (e.g., in the first and/or second directions DR1, DR2) and may be a region in which the image is not displayed. In an embodiment, the scan driver SDV, the data driver DDV, and the emission driver EDV for driving the pixels PX may be disposed in the non-display area NDA. However, embodiments of the present inventive concept are not necessarily limited thereto. For example, in some embodiments to reduce the area of the non-display area NDA, at least one of the scan driver SDV, the data driver DDV, and the emission driver EDV may be disposed in the display area DA.

Each of the pixels PX may include a light emitting element and a pixel driving circuit including transistors (e.g., a switching transistor, a driving transistor, etc.) connected to the light emitting element and at least one capacitor. Each of the pixels PX may emit light in response to an electrical signal applied to the pixels PX to display the image in the display area DA. Some of the pixels PX may include a transistor disposed in the non-display area NDA. However, embodiments of the present inventive concept are not necessarily limited thereto.

In an embodiment, the signal lines may include scan lines SL1 to SLm, data lines DL1 to DLn, emission lines EL1 to ELm, first and second control lines CSL1 and CSL2, a power line PL, and connection lines CNL. Here, "m" and "n" represent natural numbers greater than or equal to 2.

The data lines DL1 to DLn may be insulated from the scan lines SL1 to SLm and the emission lines EL1 to ELm and may cross the scan lines SL1 to SLm and the emission lines EL1 to ELm. For example, in an embodiment the scan lines SL1 to SLm may extend in the first direction DR1 to be connected to the scan driver SDV. The data lines DL1 to DLn may extend in the second direction DR2 and may be connected to the data driver DDV. The emission lines EL1 to ELm may extend in the first direction DR1 to be connected to the emission driver EDV and may be spaced apart from the scan lines SL1 to SLm in the second direction DR2.

The power line PL may extend in the second direction DR2 and be disposed in the non-display area NDA. In an embodiment, the power line PL may be disposed between the display area DA and the emission driver EDV. However, embodiments of the present disclosure are not necessarily limited thereto and an arrangement of the power line PL and the other signal lines may vary.

The connection lines CNL may extend in the first direction DR1, may arranged in the second direction DR2, and may be connected to the power line PL and the pixels PX. In an embodiment, each of the connection lines CNL may be disposed on a layer different from that of the power line PL to be electrically connected to the power line PL through a contact hole. However, embodiments of the present inventive concept are not necessarily limited thereto. For example, in an embodiment the connection lines CNL may be integrally formed on the same layer as the power line PL. A power voltage applied to the power line PL may be applied to the pixels PX through the connection lines CNL.

The first control line CSL1 may be connected to the scan driver SDV. The second control line CSL2 may be connected to the emission driver EDV.

In an embodiment, pads PD may be disposed adjacent to a lower end (e.g., in the second direction DR2) of the non-display area NDA. The pads PD may be disposed closer to the lower end of the display panel DP than the data driver DDV. The pads PD may be spaced apart from each other in the first direction DR1. Each of the pads PD may be connected to a corresponding one of the signal lines. For example, the power line PL, the first control line CSL1, and the second control line CSL2 may be electrically connected to the pads PD, and the data lines DL1 to DLn may be electrically connected to the corresponding pads PD through the data driver DDV, respectively. The pads PD may be portions to which the above-described flexible circuit board FCB (refer to FIG. 2) is electrically connected. Accordingly, an electrical signal provided from the flexible circuit board FCB (refer to FIG. 2) may be transmitted to the display panel DP through the pads PD.

The scan driver SDV may generate scan signals in response to a scan control signal. The scan signals may be applied to the pixels PX through the scan lines SL1 to SLm. The data driver DDV may generate data voltages corresponding to image signals in response to a data control signal. The data voltages may be applied to the pixels PX through the data lines DL1 to DLn. The emission driver EDV may generate emission signals in response to an emission control signal. The emission signals may be applied to the pixels PX through the emission lines EL1 to ELm.

The pixels PX may receive the data voltages in response to the scan signals. The pixels PX may emit light having a luminance corresponding to the data voltages in response to the emission signals to generate an image. An emission time of the pixels PX may be controlled by the emission signals.

Figure 5A:
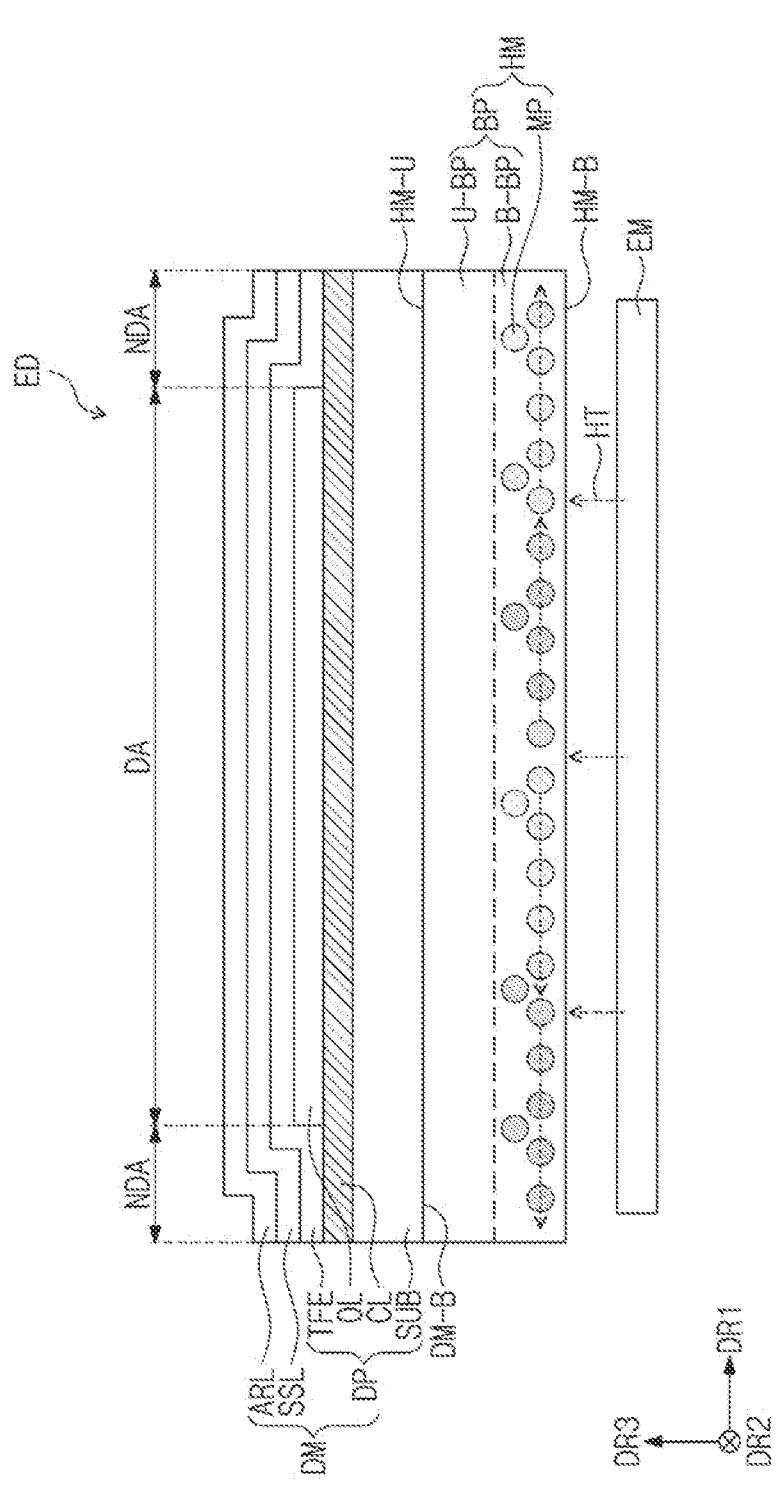
FIG. 5A is a cross-sectional view of an electronic apparatus according to an embodiment of the present inventive concept.
Figure 5B:
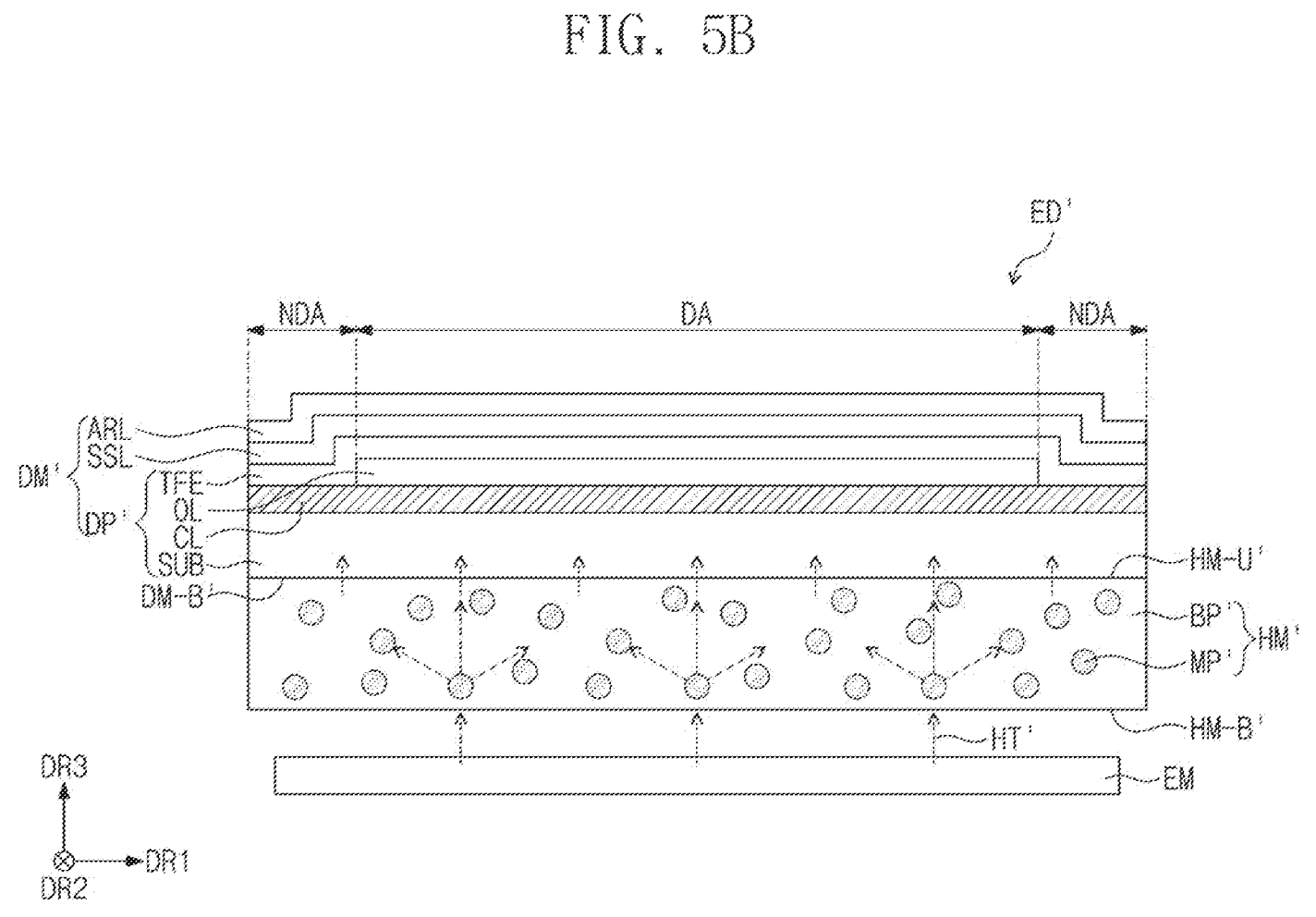

FIG. 5A is a cross-sectional view of an electronic apparatus ED according to an embodiment of the present inventive concept. FIG. 5B is a cross-sectional view of an electronic apparatus ED' according to a comparative embodiment.

Referring to FIG. 5A, the electronic apparatus ED may include a display module DM, a heat dissipation layer HM, and an electronic module EM. With respect to each configuration, the above description may be equally applied. Referring to FIG. 5B, an electronic apparatus ED' of the comparative embodiment may include a display module DM', a heat dissipation layer HM', and an electronic module EM. The difference between the heat dissipation layer HM of the embodiment and the heat dissipation layer HM' of the comparative embodiment will be described in detail later.

Referring to FIG. 5A, the display module DM may include a rear surface DM-B facing the heat dissipation layer HM. The rear surface DM-B of the display module DM may substantially correspond to a rear surface of a display panel DP. Hereinafter, the rear surface of the display panel DP will be described with the same reference numerals as the rear surface DM-B of the display module DM.

In an embodiment, the display module DM may include a display panel DP, a sensor layer SSL, and an anti-reflection layer ARL. The display panel DP may include a base substrate SUB, a circuit layer CL, a display element layer OL, and an encapsulation layer TFE.

The base substrate SUB may provide a base surface on which the circuit layer CL is disposed. The base substrate SUB may be a rigid substrate or a flexible substrate bendable, foldable, rollable, or the like. In an embodiment, the base substrate SUB may be a glass substrate, a metal substrate, or a polymer substrate. However, embodiments of the present inventive concept are not necessarily limited thereto. For example, in an embodiment the base substrate SUB may include an inorganic layer, a synthetic resin layer, or a composite material layer.

In an embodiment, the base substrate SUB may have a multilayer structure. For example, in an embodiment the base substrate SUB may include synthetic resin layers and a multi-layered or single-layered inorganic layer disposed between the synthetic resin layers. In an embodiment, each of the synthetic resin layers may include an acrylic resin, a methacrylic resin, a polyisoprene, a vinyl resin, an epoxy resin, a urethane resin, a cellulose resin, a siloxane resin, a polyamide resin, and a perylene resin. However, embodiments of the present inventive concept are not necessarily limited thereto and the arrangement of the base substrate SUB and the material of the synthetic resin layers may vary.

The circuit layer CL may be disposed on the base substrate SUB (e.g., disposed directly thereon in the third direction DR3). In an embodiment, the circuit layer CL may include at least one insulating layer, a semiconductor pattern, and a conductive pattern. The insulating layer, the semiconductor pattern, and the conductive pattern included in the circuit layer CL may form driving devices, signal lines, and pads in the circuit layer CL.

The display element layer OL may be disposed on the circuit layer CL (e.g., disposed directly thereon in the third direction DR3). The display element layer OL may include light emitting elements disposed in the display area DA. In an embodiment the light emitting elements may include an organic light emitting element, an inorganic light emitting element, a micro LED, a nano LED, or the like. However, embodiments of the present inventive concept are not necessarily limited thereto. The light emitting elements of the display element layer OL may be electrically connected to driving elements of the circuit layer CL to generate light in the display area DA in response to signals provided by the driving elements.

The encapsulation layer TFE may be disposed on the display element layer OL (e.g., disposed directly thereon in the third direction DR3) to encapsulate the light emitting elements. In an embodiment, the encapsulation layer TFE may include at least one thin film to increase optical efficiency of the display element layer OL or to protect the display element layer OL. For example, the encapsulation layer TFE may include at least one of an inorganic layer and an organic layer. In an embodiment, the encapsulation layer TFE may include a stacked structure of inorganic layers and an organic layer disposed between the inorganic layers. However, embodiments of the present inventive concept are not necessarily limited thereto. The inorganic layer of the encapsulation layer TFE may protect the light emitting element from moisture/oxygen. The organic layer of the encapsulation layer TFE may protect the light emitting element from foreign substances such as dust particles.

The sensor layer SSL may be disposed on the display panel DP (e.g., disposed thereon in the third direction DR3). In an embodiment, the sensor layer SSL may be formed on the display panel DP through a continuous process. In this embodiment, the sensor layer SSL may be directly disposed on the display panel DP without a separate adhesive layer. However, embodiments of the present inventive concept are not necessarily limited thereto. For example, in some embodiments the sensor layer SSL may be coupled to the display panel DP through an adhesive layer.

The sensor layer SSL may include at least one of an input sensor, an antenna sensor, and a fingerprint sensor. For example, in an embodiment the sensor layer SSL may include an input sensor, and the input sensor may detect an external input and may provide input signal including information about the external input such that the display panel DP generates an image corresponding to the external input. The input sensor may be driven in various ways, such as a capacitive manner, a resistive manner, an infrared manner, an acoustic wave manner, or a pressure manner. However, embodiments of the present inventive concept are not necessarily limited thereto.

The anti-reflection layer ARL may be disposed on the sensor layer SSL (e.g., disposed thereon in the third direction DR3). For example, in an embodiment the anti-reflection layer ARL may be directly disposed on the sensor layer SSL (e.g., in the third direction DR3). However, embodiments of the present inventive concept are not necessarily limited thereto. For example, in some embodiments the anti-reflection layer ARL may be coupled to the sensor layer SSL through an adhesive layer. The anti-reflection layer ARL may reduce reflectance of external light incident from the outside of the electronic apparatus ED. The anti-reflection layer ARL may have various embodiments that reduce the reflectance of the external light.

In an embodiment, the anti-reflection layer ARL may include a phase retarder and/or a polarizer. The phase retarder and the polarizer may be provided as a film type or a liquid crystal coating type, respectively. However, embodiments of the present inventive concept are not necessarily limited thereto. For example, in an embodiment, the phase retarder and the polarizer may be provided in a form of one polarizing film.

According to an embodiment, the anti-reflection layer ARL may include a destructive interference structure. For example, the anti-reflection layer ARL may include a plurality of reflective layers disposed on different layers to destructively interfere with reflected light.

In an embodiment, the anti-reflection layer ARL may include color filters. The color filters may be disposed to correspond to an arrangement of the pixels PX (refer to FIG. 4) included in the display panel DP and a color emitted from the pixels PX. The color filters may receive external light and filter the external light with the same color as the color emitted by the pixels PX (refer to FIG. 4). The anti-reflection layer ARL may further include a black matrix disposed adjacent to the color filters.

FIG. 5A illustrates an embodiment in which the sensor layer SSL and the anti-reflection layer ARL are sequentially disposed on the display panel DP. However, embodiments of the present inventive concept are not necessarily limited thereto. For example, in some embodiments a stacking order of the anti-reflection layer ARL and the sensor layer SSL may be changed, or one of the sensor layer SSL and the anti-reflection layer ARL may be omitted.

The heat dissipation layer HM may be disposed on the rear surface DM-B of the display panel DP. For example, in an embodiment the heat dissipation layer HM may be disposed directly on the rear surface DM-B of the display panel DP (e.g., a base surface). The heat dissipation layer HM may include a base portion BP and conductive particles MP distributed (e.g., dispersed) in the base portion BP.

The base portion BP may directly contact the rear surface DM-B of the display panel DP. For example, the base portion BP may directly contact the base substrate SUB of the display panel DP. For example, in an embodiment the base portion BP may be coupled to the base substrate SUB without a separate adhesive layer disposed between the base substrate SUB and the base portion BP.

In an embodiment, the base portion BP may include a polymer resin. For example, the base portion BP may include a polyurethane resin, a polyethylene resin, an acrylate resin, or the like. However, embodiments of the present inventive concept are not necessarily limited thereto and a material of the polymer resin may vary.

The base portion BP may include the polymer resin, and the conductive particles MP may be dispersed in the base portion BP. The base portion BP may have flexibility. As the base portion BP has flexibility, the heat dissipation layer HM may also be applied to a flexible electronic apparatus ED. In addition, as the base portion BP has flexibility, the heat dissipation layer HM may absorb a shock delivered from the outside toward the display panel DP. Accordingly, the heat dissipation layer HM may protect the display panel DP without disposing a separate shock absorbing layer on the rear surface DM-B of the display panel DP. Therefore, a stack structure of the electronic apparatus ED may be simplified and provided with a relatively thin thickness.

The base portion BP may include a first surface HM-U facing the rear surface DM-B of the display panel DP and a second surface HM-B opposite to the first surface HM-U (e.g., in the third direction DR3). The first surface HM-U of the base portion BP may correspond to an upper surface of the base portion BP and may directly contact the rear surface DM-B of the display panel DP. The second surface HM-B of the base portion BP may correspond to a lower surface of the base portion BP and may be spaced apart from the rear surface DM-B of the display panel DP (e.g., in the third direction DR3).

The first surface HM-U of the base portion BP may substantially correspond to an upper surface of the heat dissipation layer HM facing and directly contacting the rear surface DM-B of the display panel DP in the third direction DR3. The second surface HM-B of the base portion BP may be substantially opposite to the upper surface of the heat dissipation layer HM in the third direction DR3 and may correspond to the lower surface of the heat dissipation layer HM to be spaced apart from the rear surface DM-B of the display panel DP (e.g., in the third direction DR3).

The base portion BP may include an upper portion U-BP and a lower portion B-BP arranged in the third direction DR3. The upper portion U-BP of the base portion BP may be positioned closer to the display panel DP than the lower portion B-BP, and may be a portion that directly contacts the display panel DP. The lower portion B-BP of the base portion BP may be a portion positioned under the upper portion U-BP of the base portion BP in the third direction DR3. For example, the lower portion B-BP of the base portion BP may be a portion spaced apart from the display panel DP with the upper portion U-BP interposed therebetween (e.g., in the third direction DR3). In an embodiment, the flexible circuit board FCB (FIG. 2), the electronic module EM (FIG. 2) and the power source module PSM (FIG. 2) may be disposed under the lower portion B-BP of the base portion BP (e.g., in the third direction DR3). The upper portion U-BP of the base portion BP may define the first surface HM-U of the base portion BP, and the lower portion B-BP of the base portion BP may define the second surface HM-B of the base portion BP. While the upper portion U-BP and the lower portion B-BP are shown in an embodiment of FIG. 5A having substantially similar thicknesses to each other, embodiments of the present inventive concept are not necessarily limited thereto.

In an embodiment, the upper portion U-BP and the lower portion B-BP of the base portion BP may be integrally formed of the same material, and accordingly, the base portion BP may be provided as a substantially single layer. In this embodiment, the upper portion U-BP and the lower portion B-BP of the base portion BP are described as being separately arranged to describe a distribution of the conductive particles MP, but may correspond to different portions of the base portion BP provided substantially integrally.

The conductive particles MP may have a certain size and may be dispersed in the base portion BP. The conductive particles MP may not be in a form of a thin film. Each of the conductive particles MP may include a material having conductivity. For example, the conductive particles MP may include a metal material, such as copper (Cu) and/or silver (Ag). However, embodiments of the present inventive concept are not necessarily limited thereto and the conductive material of the conductive particles MP may vary.

Referring to FIG. 5A, the conductive particles MP may be densely distributed in a specific region of the base portion BP and may not be densely distributed in another specific region of the base portion BP. In an embodiment, the conductive particles MP may be densely distributed in the specific region of the base portion BP that is spaced apart from the display panel DP (e.g., in the third direction DR3). For example, as illustrated in FIG. 5A, the conductive particles MP may be densely distributed in the lower portion B-BP of the base portion BP, and may not be substantially distributed in the upper portion U-BP. Therefore, based on the same volume, a density of the conductive particles MP in the lower portion B-BP of the base portion BP may be greater than a density of the conductive particles MP in the upper portion U-BP of the base portion BP. However, the distribution form of the conductive particles MP is not necessarily limited to that shown in FIG. 5A, and the distribution form of the conductive particles MP may vary in which the conductive particles MP are more densely distributed in the lower portion B-BP of the base portion BP as compared to a portion of the base portion BP immediately adjacent the rear surface DM-B of the display panel DP.

The conductive particles MP may be spaced apart from the first surface HM-U of the base portion BP, and the conductive particles MP may not be dispersed in the region adjacent to the first surface HM-U of the base portion BP. In an embodiment, the density of the distribution of the conductive particles MP may increase from the first surface HM-U towards the second surface HM-B in the base portion BP. Accordingly, the conductive particles MP may be dispersed in a region adjacent to the second surface HM-B of the base portion BP, and the density of the conductive particles MP may be relatively large in the region adjacent to the second surface HM-B as compared to the region adjacent to the first surface HM-U.

Electronic components such as an electronic module EM or a power source module PSM (refer to FIG. 2) disposed under the display panel DP may generate heat HT, and the heat HT generated from the electronic components may be diffused toward the display panel DP. However, the heat dissipation layer HM may be disposed between the display panel DP and electronic components (e.g., the electronic module EM) and thus dissipate the heat HT generated from the electronic components may not to be transferred to the display panel DP.

The heat dissipation layer HM' of the comparative embodiment may include a base portion BP' and conductive particles MP'. However, a distribution of the conductive particles MP' in the comparative embodiment shown in FIG. 5B may be different from the distribution of the conductive particles MP of an embodiment of the present inventive concept shown in FIG. 5A. Referring to FIG. 5B, the conductive particles MP' of the comparative embodiment may be uniformly dispersed in substantially the entire region of the base portion BP'. For example, the density of the distribution of the conductive particles MP' of the comparative embodiment may not be greater in a specific region of the base portion BP', but may be uniformly distributed in upper and lower portions of the base portion BP'.

In the comparative embodiment, as the conductive particles MP' are uniformly dispersed in the base portion BP', the conductive particles MP' may be substantially equally distributed in both the region adjacent to the first surface HM-U' of the base portion BP' and the region of the second surface HM-B' of the base portion BP'. Accordingly, some of the conductive particles MP' may be distributed in the region immediately adjacent to the rear surface DM-B' of the display panel DP'.

Due to a difference in the distribution of the conductive particles MP', the heat dissipation layer HM' of the comparative embodiment shown in FIG. 5B may not effectively dissipate heat HT' generated from electronic components such as the electronic module EM, compared to the heat dissipation layer HM of an embodiment of the present inventive concept as shown in FIG. 5A. For example, a path through which the heat is transferred may be variable depending on a distribution shape of the conductive particles MP dispersed in the base portion BP, and the heat dissipation layer HM according to an embodiment having the conductive particles MP densely formed in a specific region of the base portion BP and not densely formed in another specific region of the base portion BP may effectively block the heat HT from being transferred to the display panel DP as compared to the heat dissipation layer HM' of the comparative embodiment having the conductive particles MP' uniformly distributed over the entire region of the base portion BP'. For convenience of explanation, FIG. 5A briefly illustrates a path in which heat HT is radiated in the heat dissipation layer HM of an embodiment, and FIG. 5B briefly illustrates a path through which heat HT' is radiated in the heat dissipation layer HM' of the comparative embodiment.

Referring to FIG. 5A, the heat HT generated from the electronic module EM may be anisotropically transmitted by the conductive particles MP concentrated in the lower portion B-BP of the base portion BP. For example, the heat HT may be transferred along the conductive particles MP concentrated in the lower portion B-BP to be radiated to the outside of the display panel DP. The conductive particles MP of the heat dissipation layer HM may not be substantially dispersed in the upper portion U-BP of the base portion BP adjacent to the display panel DP, but may be dispersed in a relatively large density in the lower portion B-BP, and thus the heat HT diffused in the heat dissipation layer HM may be prevented from being transferred to the display panel DP.

Referring to FIG. 5B, the heat HT' generated from the electronic module EM may be isotropically transmitted by the conductive particles MP' evenly distributed over the entire region of the base portion BP'. Since the conductive particles MP' are dispersed in the region adjacent to the rear surface DM-B' of the display panel DP', the heat HT' may be transferred toward the display panel DP'. Accordingly, the heat dissipation layer HM' of the comparative embodiment may not block the heat HT' transferred to the display panel DP', and the display panel DP' may be damaged by the heat HT'.

Referring back to FIG. 5A, the heat dissipation layer HM according to an embodiment may have a function other than heat dissipation as the conductive particles MP are concentrated in the lower portion B-BP of the base portion BP. The conductive particles MP may not be substantially distributed in the upper portion U-BP of the base portion BP, and thus the upper surface of the heat dissipation layer HM corresponding to the first surface HM-U of the base portion BP may not have conductivity. The density of the distribution of the conductive particles MP may be large in the lower portion B-BP of the base portion BP, and thus the lower surface of the heat dissipation layer HM corresponding to the second surface HM-B of the base portion BP may have conductivity. For example, as the distribution density of the conductive particles MP is large in the lower portion B-BP, an effect similar to that in which a conductive layer is disposed under the base portion BP may be obtained.

The lower surface of the heat dissipation layer HM may have conductivity, and thus electromagnetic waves generated from electronic components such as an electronic module EM, a power source module PSM (refer to FIG. 2), or an electro-optical module EOM (refer to FIG. 2) may be shielded. Accordingly, the heat dissipation layer HM may prevent the electromagnetic waves generated from the electronic components disposed under the display panel DP from being transmitted to the display panel DP as noise. In addition, the heat dissipation layer HM may shield the electromagnetic waves without a separate electromagnetic wave shielding layer on the rear surface DM-B of the display panel DP, and thus the display panel DP may be protected, and a stacked structure of the electronic apparatus ED may be simplified.

The lower surface of the heat dissipation layer HM may have conductivity, and thus an electrostatic path may be formed on the lower surface of the heat dissipation layer HM. Accordingly, when static electricity is generated, the heat dissipation layer HM may discharge the static electricity, thereby preventing the electronic components of the flexible circuit board FCB (refer to FIG. 2) disposed adjacent to the lower surface of the heat dissipation layer HM and the data driver DDV (refer to FIG. 2) from being damaged by the static electricity. In addition, the heat dissipation layer HM may have anti-static characteristics to protect the display panel DP without a separate conductive layer for preventing static electricity on the rear surface DM-B of the display panel DP, thereby protecting the display panel DP and simplifying the stacked structure of the electronic apparatus ED.

The density of the distribution of the conductive particles MP of the heat dissipation layer HM may be large in the lower portion B-BP, and thus the dense conductive particles MP may block light emitted to the rear surface of the display panel DP. Accordingly, the heat dissipation layer HM may prevent the electronic components disposed under the display panel DP from being visibly recognized or viewed from the outside by the user due to the light emitted from the rear surface of the display panel DP.

Figure 6:
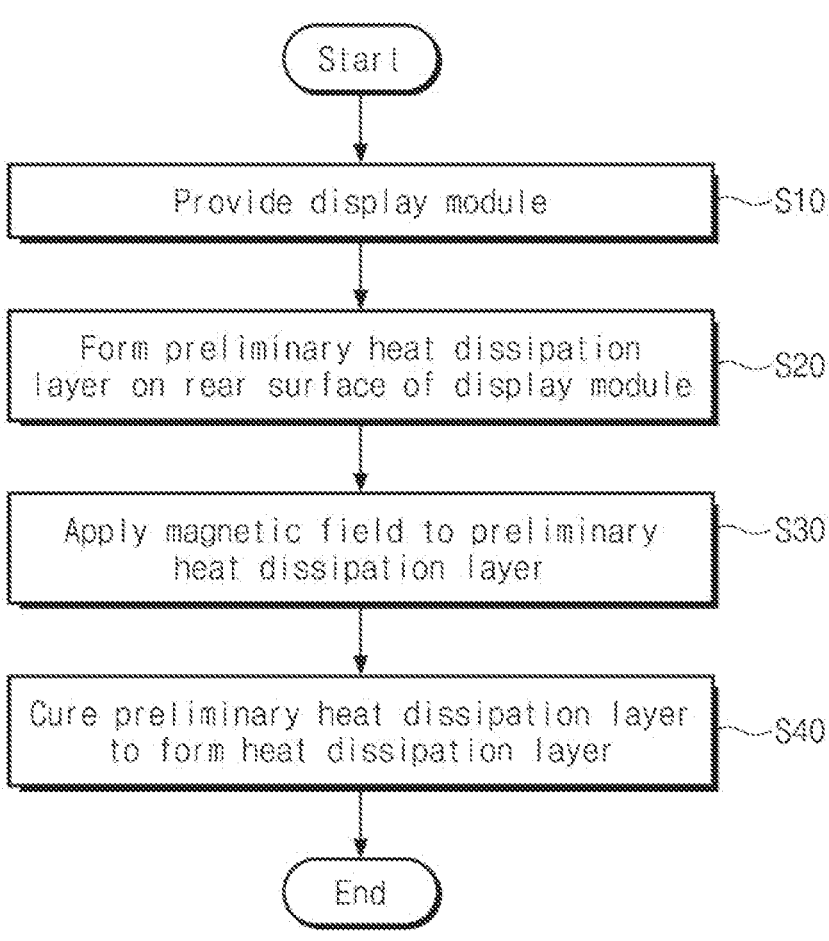
FIG. 6 is a flowchart illustrating a method of manufacturing an electronic apparatus according to an embodiment of the present inventive concept.

FIG. 6 is a flowchart illustrating a method of manufacturing an electronic apparatus according to an embodiment of the present inventive concept.

Referring to FIG. 6, the method of manufacturing the electronic apparatus according to an embodiment may include providing a display module in block S10, forming a preliminary heat dissipation layer on a rear surface of the display module in block S20, applying a magnetic field to the preliminary heat dissipation layer in block S30, and curing the preliminary heat dissipation layer to form a heat dissipation layer in block S40. A detailed description of each step will be described later with reference to the drawings.

FIGS. 7A to 7E are cross-sectional views illustrating a method of manufacturing an electronic apparatus according to embodiments of the present inventive concept.

Figure 7A:
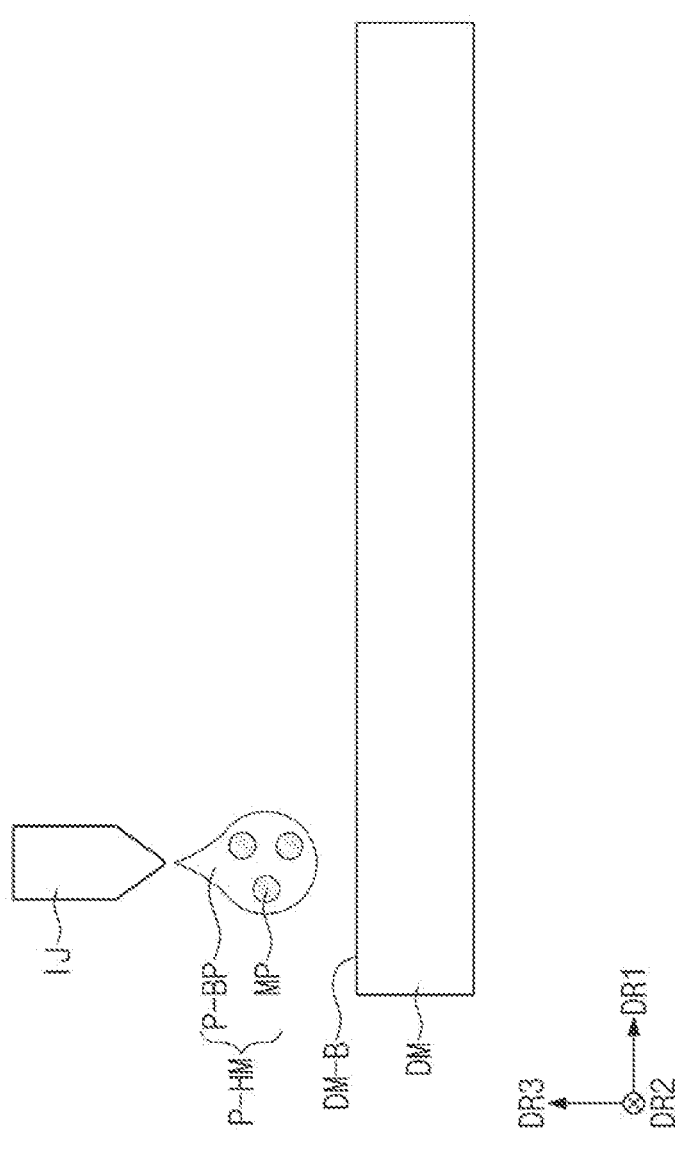
FIGS. 7A to 7E are cross-sectional views illustrating a method of manufacturing an electronic apparatus according to embodiments of the present inventive concept.

FIG. 7A corresponds to providing the display module in block S10 (refer to FIG. 6). Referring to FIG. 7A, the display module DM including the display panel DP (refer to FIG. 5A) may be provided under a coating device U. In an embodiment, the display module DM may include only the display panel DP (refer to FIG. 5A), or may correspond a structure further including at least one of the sensor layer SSL (refer to FIG. 5A) and the anti-reflection layer ARL (refer to FIG. 5A) on the display panel DP (refer to FIG. 5A).

The display module DM may be provided such that the coating device U and the rear surface DM-B of the display module DM face each other. As described above, the rear surface DM-B of the display module DM may be defined by the rear surface DM-B of the display panel DP (refer to FIG. 5A). For example, the display module DM may be provided such that the rear surface DM-B of the display panel DP (refer to FIG. 5A) faces the coating device U.

The coating device IJ may apply a composition of the preliminary heat dissipation layer P-HM on the rear surface DM-B of the display module DM. The composition of the preliminary heat dissipation layer P-HM may include a base resin P-BP in which conductive particles MP are dispersed.

In an embodiment, the base resin P-BP may include an ultraviolet curable material. The base resin P-BP may include a polymer resin. For example, the base resin P-BP may include a polyurethane resin, a polyethylene resin, an acrylate resin, etc. However, embodiments of the present inventive concept are not necessarily limited thereto.

Each of the conductive particles MP may include a conductive material. For example, in an embodiment the conductive particles MP may include a metal material such as copper (Cu) and/or silver (Ag). However, embodiments of the present inventive concept are not necessarily limited thereto and the conductive material included in the conductive particles MP may vary.

Although an embodiment of FIG. 7A shows the forming of the preliminary heat dissipation layer P-HM by using an inkjet discharged from a nozzle of the coating device U, the method of forming the preliminary heat dissipation layer P-HM is not necessarily limited thereto. For example, in some embodiments the preliminary heat dissipation layer P-HM may be formed by a silk screen method, a slot-die method or another method in which the preliminary heat dissipation layer P-HM is coated on the rear surface DM-B of the display module DM.

Figure 7B:
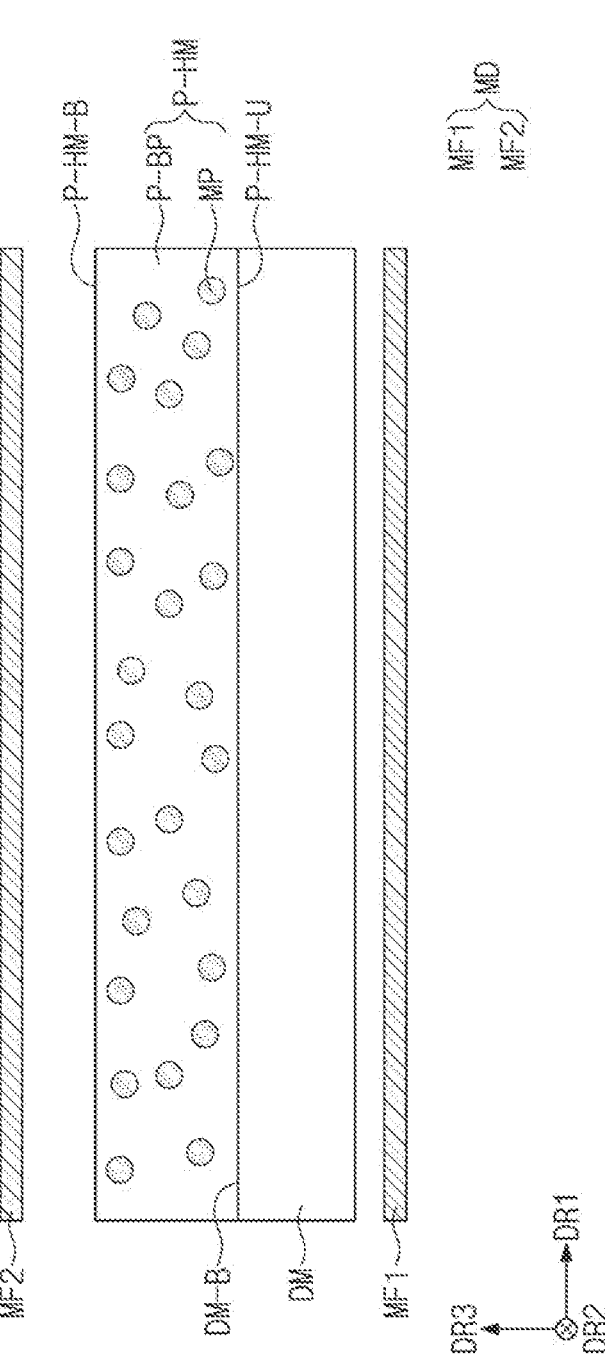

FIG. 7B corresponds to forming the preliminary heat dissipation layer P-HM in block S20 (refer to FIG. 6). The preliminary heat dissipation layer P-HM may be coated on (e.g., directly thereon) the rear surface DM-B of the display module DM. The preliminary heat dissipation layer P-HM may include a first surface P-HM-U facing the rear surface DM-B of the display module DM and a second surface P-HM-B opposite to the first surface P-HM-U in the third direction DR3. The first surface P-HM-U may directly contact the rear surface DM-B of the display module DM and may correspond to an upper surface of the preliminary heat dissipation layer P-HM. The second surface P-HM-B may be spaced apart from the display module DM (e.g., in the third direction DR3) and may correspond to a lower surface of the preliminary heat dissipation layer P-HM.

The preliminary heat dissipation layer P-HM of FIG. 7B may correspond to a state before the base resin P-BP is cured. The base resin P-BP may be directly formed on the rear surface DM-B of the display module DM. For example, the base resin P-BP may directly contact the rear surface DM-B of the display module DM.

The conductive particles MP may be substantially uniformly dispersed in the entire region of the base resin P-BP before being cured. For example, in the preliminary heat dissipation layer P-HM, the density of the distribution of the conductive particles MP may not be large in a specific region and low (or substantially zero) in another specific region. Before the inside of the base resin P-BP is cured, the conductive particles MP may have fluidity in the base resin P-BP.

To apply the magnetic field to the preliminary heat dissipation layer P-HM, the display module DM in which the preliminary heat dissipation layer P-HM is formed may be provided in a magnetic field generating device MD in block S30. In an embodiment, the magnetic field generating device MD may include plates MF1 and MF2 which are magnetic. The display module DM may be disposed between the plates MF1 and MF2 such that a magnetic field is applied to the preliminary heat dissipation layer P-HM. However, a configuration of the magnetic field generating device MD is not necessarily limited thereto as long as the magnetic field is applied to the preliminary heat dissipation layer P-HM in a certain direction.

Figure 7C:
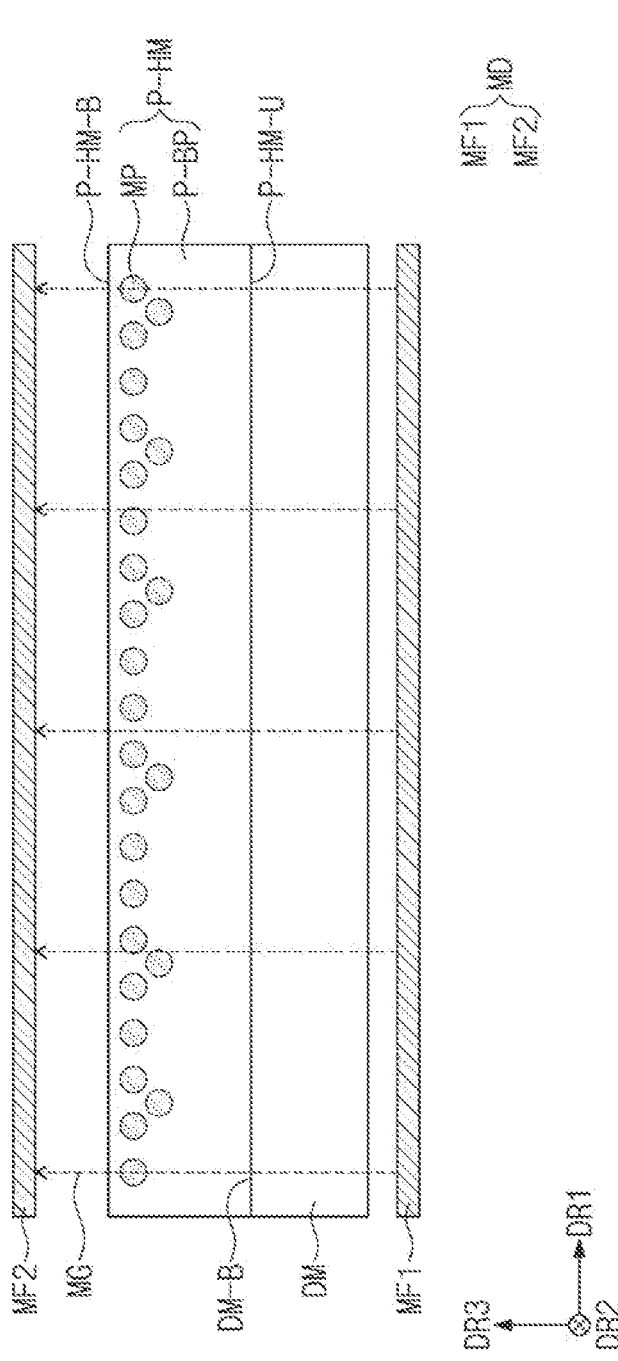

FIG. 7C corresponds to applying the magnetic field to the preliminary heat dissipation layer P-HM in block S30 (refer to FIG. 6). FIG. 7C schematically illustrates magnetic force lines MG of the magnetic field applied to the preliminary heat dissipation layer P-HM.

The magnetic field may be applied from the first surface P-HM-U to the second surface P-HM-B of the preliminary heat dissipation layer P-HM, within the preliminary heat dissipation layer P-HM. Accordingly, the conductive particles MP having fluidity in the base resin P-BP may move away from the first surface P-HM-U and flow towards the second surface P-HM-B. Therefore, the density of the distribution of the conductive particles MP may be large in a region adjacent to the second surface P-HM-B, and the conductive particles MP may not be substantially disposed in a region adjacent to the first surface P-HM-U.

For example, the conductive particles MP may hardly be dispersed in the upper portion of the preliminary heat dissipation layer P-HM that is in direct contact with the rear surface DM-B of the display module DM, and the conductive particles MP may be densely dispersed in the lower portion of the preliminary heat dissipation layer P-HM that is spaced apart from the display module DM.

Figure 7D:
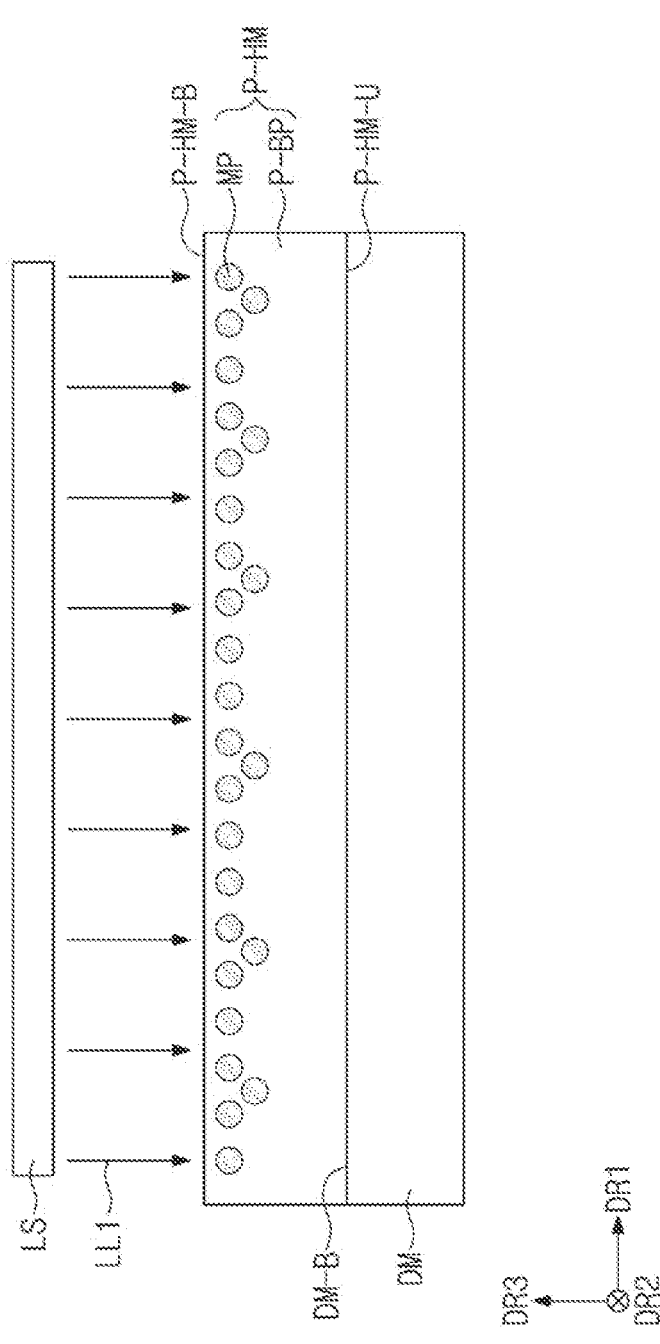
Figure 7E:
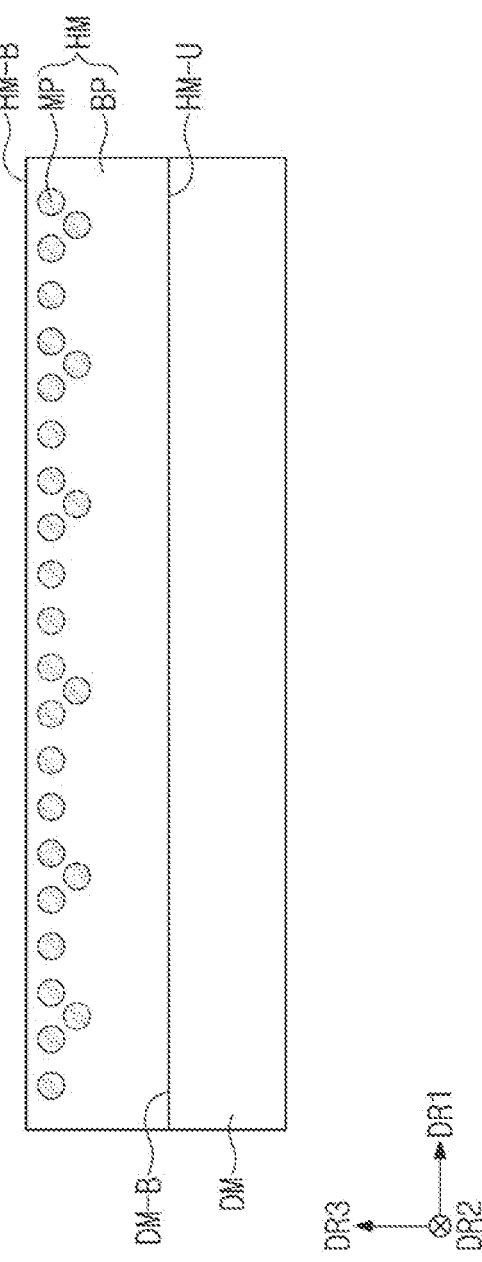

FIG. 7D corresponds to curing the preliminary heat dissipation layer P-HM in block S40 (refer to FIG. 6), and FIG. 7E corresponds to a cross-sectional view of the heat dissipation layer HM formed after the curing of the preliminary heat dissipation layer P-HM.

Referring to an embodiment shown in FIG. 7D, to cure the base resin P-BP of the preliminary heat dissipation layer P-HM, a light irradiation device LS may be provided on the preliminary heat dissipation layer P-HM. In an embodiment, the light irradiation device LS may be disposed to face the second surface P-HM-B of the preliminary heat dissipation layer P-HM. The light irradiation device LS may irradiate a light LL1 on the preliminary heat dissipation layer P-HM. In an embodiment, the light LL1 may be ultraviolet light. However, embodiments of the present inventive concept are not necessarily limited thereto.

Referring to FIGS. 7D and 7E, when the conductive particles MP are densely distributed in the region adjacent to the second surface P-HM-B of the base resin P-BP, the base resin P-BP may be cured by the light LL1. The base resin P-BP may be cured to a surface and an inside thereof to form the base portion BP (FIG. 7E) of the heat dissipation layer HM.

The density of the distribution of the conductive particles MP dispersed in the base portion BP of the heat dissipation layer HM may be large in the region adjacent to the second surface HM-B of the base portion BP by the applying of the magnetic field. For example, the conductive particles MP may be densely distributed in the region of the base portion BP that is relatively farther apart from the rear surface DM-B of the display module DM. The above description may be equally applied to the base portion BP and the conductive particles MP.

In an embodiment, the method of manufacturing the electronic apparatus may further include pre-curing the preliminary heat dissipation layer P-HM before the applying of the magnetic field to the preliminary heat dissipation layer P-HM in block S30 (refer to FIG. 6). This will be described in detail with reference to FIGS. 8A to 8D.

FIGS. 8A to 8D are cross-sectional views illustrating a method of manufacturing an electronic apparatus according to embodiments of the present inventive concept.

Figure 8A:
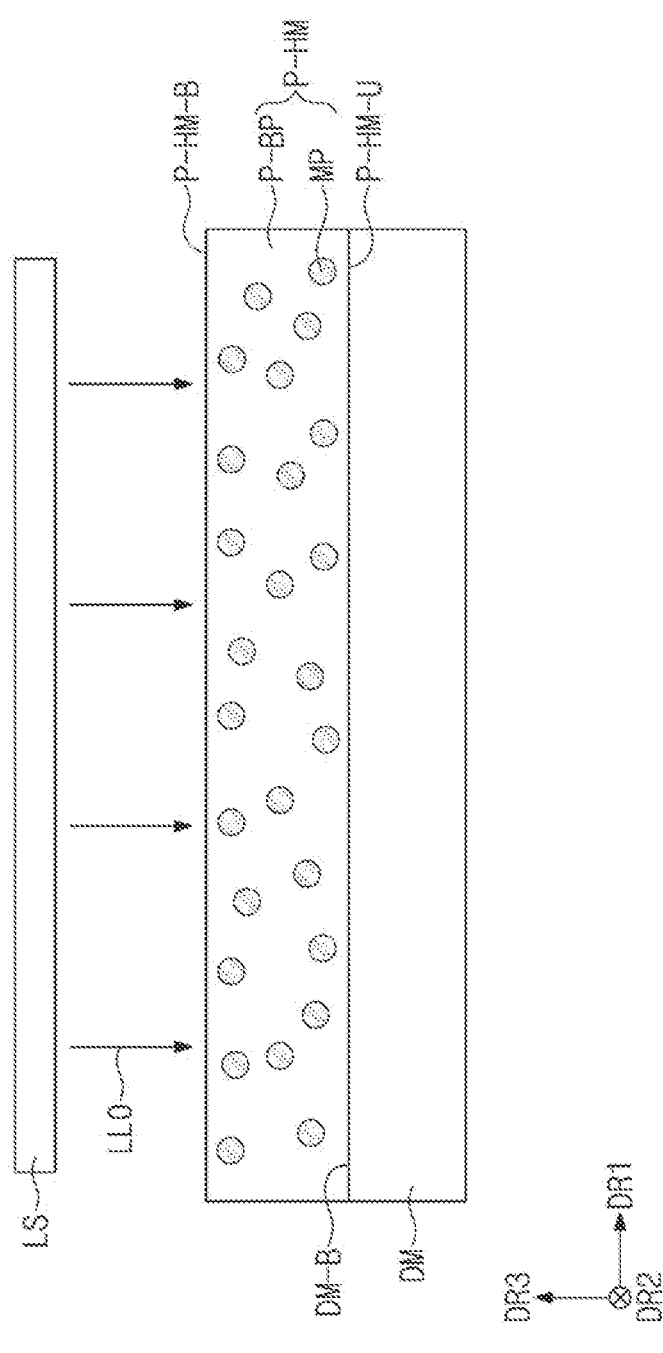
FIGS. 8A to 8D are cross-sectional views illustrating a method of manufacturing an electronic apparatus according to embodiments of the present inventive concept.
Figure 8B:
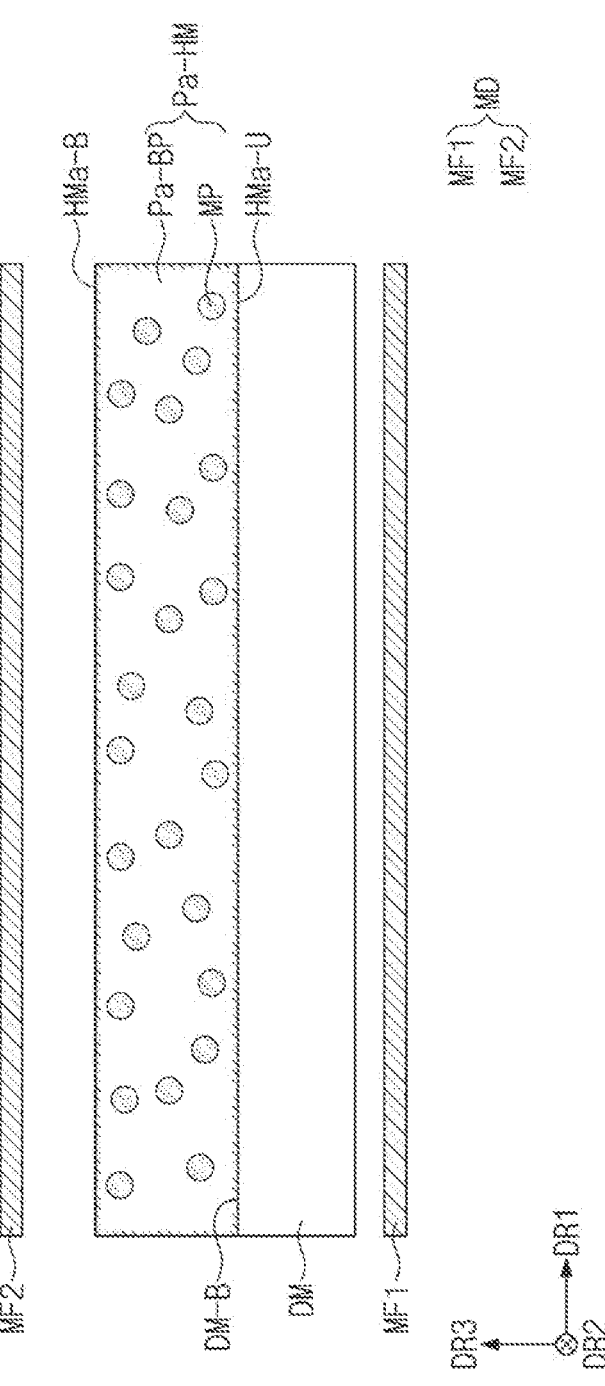

FIG. 8A corresponds to pre-curing a preliminary heat dissipation layer P-HM. FIG. 8B corresponds to forming a pre-cured preliminary heat dissipation layer Pa-HM. The preliminary heat dissipation layer P-HM of FIG. 8A may be formed through the forming of the preliminary heat dissipation layer P-HM in block S20 (refer to FIG. 6) shown in FIG. 7A.

Referring to FIG. 8A, to pre-cure the preliminary heat dissipation layer P-HM, a light irradiation device LS may be placed on the preliminary heat dissipation layer P-HM to face the second surface P-HM-B. The light irradiation device LS may irradiate a first light LL0 on the preliminary heat dissipation layer P-HM. In an embodiment, the first light LL0 may be ultraviolet light. However, embodiments of the present inventive concept are not necessarily limited thereto.

Referring to FIGS. 8A and 8B, in the pre-curing of the preliminary heat dissipation layer P-HM, the first light LL0 may cure only a surface (e.g., an exterior surface) of the preliminary heat dissipation layer P-HM and may not cure an interior of the preliminary heat dissipation layer P-HM. For example, the base resin Pa-BP of the pre-cured preliminary heat dissipation layer Pa-HM may have only the surface cured and may have fluidity inside (e.g., in an interior of the preliminary heat dissipation layer P-HM). By controlling intensity of the first light LL0 and/or irradiation time of the first light LL0, the light irradiation device LS may irradiate the first light LL0 sufficiently to cure only the surface of the preliminary heat dissipation layer P-HM.

Accordingly, the conductive particles MP may have fluidity in the interior of the pre-cured preliminary heat dissipation layer Pa-HM. At the same time, a first surface HMa-U and a second surface HMa-B corresponding to surfaces of the pre-cured preliminary heat dissipation layer Pa-HM may be cured, and thus the pre-cured preliminary heat dissipation layer Pa-HM may be prevented from flowing towards an outside of the display module DM.

Referring to FIG. 8B, a display module DM on which the pre-cured preliminary heat dissipation layer Pa-HM is formed may be provided in a magnetic field generating device MD. Except for whether the preliminary heat dissipation layer P-HM is pre-cured, the description described above with reference to FIG. 7B may be applied in the same manner.

Figure 8C:
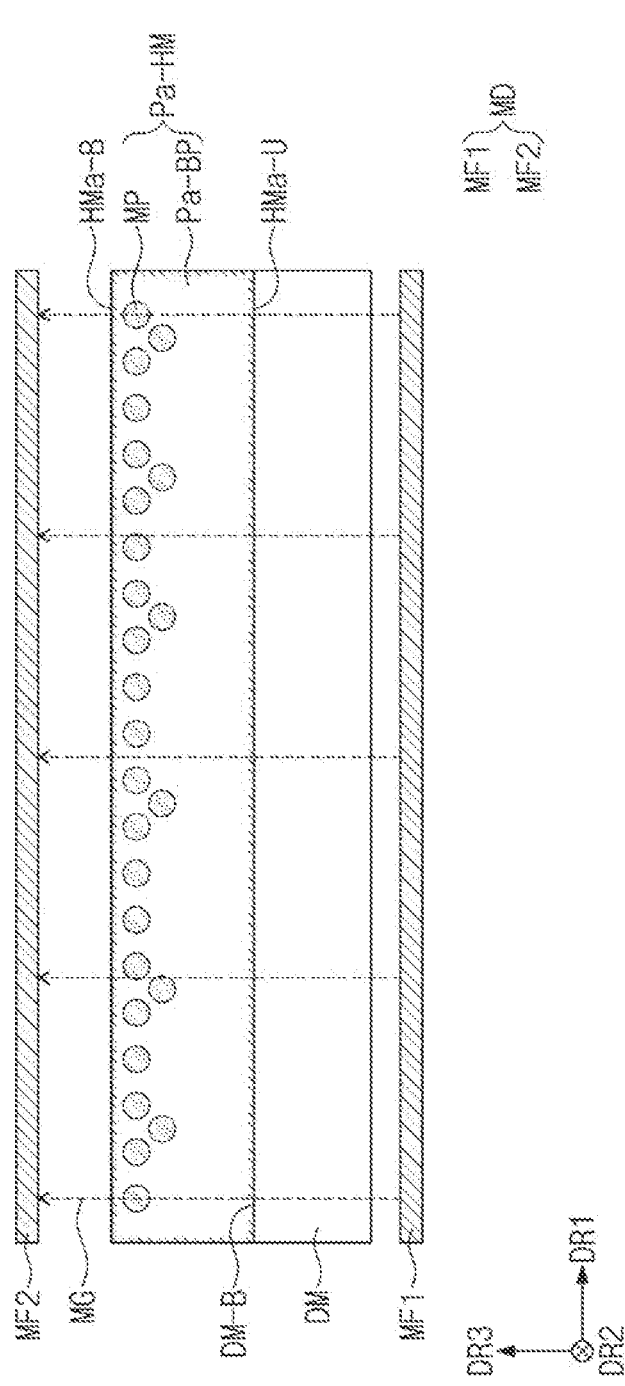

FIG. 8C corresponds to applying a magnetic field to the pre-cured preliminary heat dissipation layer Pa-HM. FIG. 8C schematically illustrates magnetic force lines MG of the magnetic field applied to the pre-cured preliminary heat dissipation layer Pa-HM. With respect to the applying the magnetic field to the pre-cured preliminary heat dissipation layer Pa-HM shown in FIG. 8C, except for whether the preliminary heat dissipation layer P-HM is pre-cured, the description described above with reference to FIG. 7C may be applied in the same manner.

The surfaces (e.g., the first surface HMa-U and the second surface HMa-B) of the pre-cured preliminary heat dissipation layer Pa-HM may be cured and the inside thereof may have fluidity, and thus the conductive particles MP may flow in the base resin Pa-BP by an applied magnetic field. The conductive particles MP may flow so that the density of the distribution of the conductive particles MP may be large in a region adjacent to the second surface HMa-B by the magnetic field and the conductive particles MP may be substantially not disposed in the region adjacent to the rear surface DM-B of the display module DM.

Figure 8D:
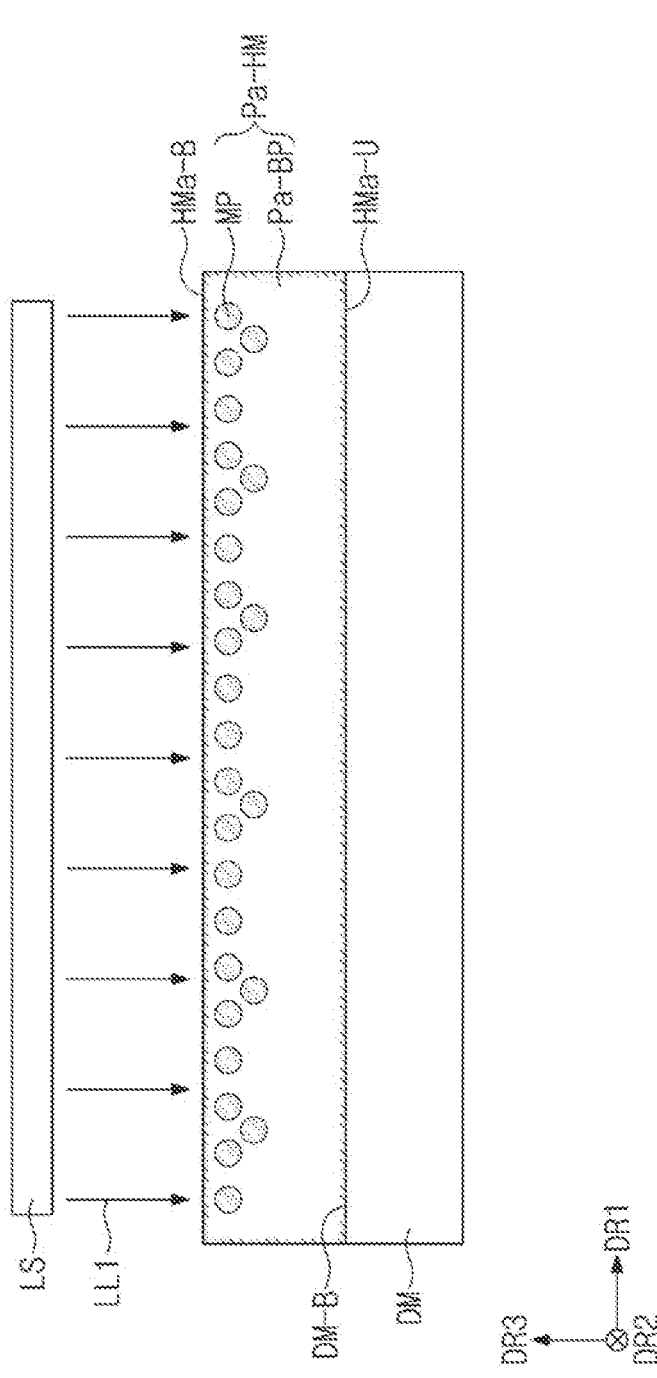

FIG. 8D corresponds to curing the pre-cured preliminary heat dissipation layer Pa-HM. Referring to FIG. 8D, to completely cure the base resin Pa-BP of the pre-cured preliminary heat dissipation layer Pa-HM, the light irradiation device LS may be provided on the second surface HMa-B. The light irradiation device LS may irradiate a second light LL1 to the pre-cured preliminary heat dissipation layer Pa-HM such that the interior of the base resin Pa-BP is cured as well as the surface. In an embodiment, the second light LL1 may be ultraviolet light.

In an embodiment, process conditions of irradiating the first light LL0 (refer to FIG. 8A) in the pre-curing of the preliminary heat dissipation layer P-HM (refer to FIG. 8A) and process conditions for irradiating the second light LL1 in the curing of the pre-cured preliminary heat dissipation layer Pa-HM may be different from each other. For example, an irradiating time of the first light LL0 and an irradiating time of the second light LL1 may be different from each other, and/or an intensity of the first light LL0 and an intensity of the second light LL1 may be different from each other.

The pre-cured preliminary heat dissipation layer Pa-HM may be cured to the interior thereof by using the second light LL1, and thus the heat dissipation layer HM shown in FIG. 7E may be formed on the rear surface DM-B of the display module DM.

The heat dissipation layer according to an embodiment may include the base resin formed on the rear surface of the display panel and the conductive particles intensively distributed (e.g., with a high distribution density) in the specific region of the base resin that is spaced apart from the rear surface DM-B of the display panel DP. The heat generated from the electronic module or electronic components disposed on the rear surface of the display panel may be dissipated along the conductive particles MP concentrated in the lower portion of the base resin, and thus the heat dissipation layer of an embodiment of the present inventive concept may prevent the heat from being transferred to the display panel.

The conductive particles of the heat dissipation layer may be concentrated in the lower portion of the base resin, and thus the heat dissipation layer may have conductivity on a surface that is spaced apart from the rear surface of the display panel and the heat dissipation layer may play a role of blocking electromagnetic waves, blocking static electricity, blocking light, and so forth in addition to heat dissipation. In addition, the heat dissipation layer may be directly disposed on the rear surface of the display panel, and thus the electronic apparatus including the heat dissipation layer while having a reduced thickness may be provided.

In the method of manufacturing the electronic apparatus according to an embodiment, the magnetic field may be applied to the base resin formed on the rear surface of the display panel and in which conductive particles are dispersed, and thus the conductive particles may have a large distribution density in the region that is spaced apart from the display panel in the base resin. Accordingly, the heat dissipation layer having an increased heat dissipation may be formed on the rear surface of the display panel.

While embodiments are described above, a person skilled in the art may understand that many modifications and variations are made without departing from the spirit and scope of the present inventive concept.

Accordingly, the described embodiments should be considered in all respects as illustrative and not restrictive, with the spirit and scope of the present inventive concept.

What is claimed is:

1. An electronic apparatus comprising:
a display panel having a rear surface; and
a heat dissipation layer disposed on the rear surface of the display panel,
wherein the heat dissipation layer includes:
a base portion including a first surface facing the rear surface and a second surface opposite to the first surface; and
conductive particles dispersed in the base portion,
wherein the conductive particles are spaced apart from the first surface, and a density of a distribution of the conductive particles increases from the first surface to the second surface,
wherein the conductive particles prevent transfer of heat to the display panel.

2. The electronic apparatus of claim 1, wherein the first surface of the base portion directly contacts the rear surface of the display panel.

3. The electronic apparatus of claim 1, wherein:
the display panel includes a base substrate defining the rear surface of the display panel and light emitting elements disposed on the base substrate,
wherein the heat dissipation layer directly contacts the base substrate.

4. The electronic apparatus of claim 1, wherein a conductivity of the heat dissipation layer on the second surface is greater than a conductivity of the heat dissipation layer on the first surface.

5. The electronic apparatus of claim 1, wherein the base portion includes a polymer resin.

6. The electronic apparatus of claim 1, wherein each of the conductive particles includes a metal material.

7. The electronic apparatus of claim 1, further comprising a flexible circuit board electrically connected to the display panel and disposed under the second surface of the base portion.

8. The electronic apparatus of claim 1, further comprising an electronic module disposed under the second surface of the base portion.

9. The electronic apparatus of claim 1, further comprising a window disposed on the display panel.

10. The electronic apparatus of claim 9, further comprising a sensor layer disposed between the display panel and the window.

11. The electronic apparatus of claim 9, further comprising an anti-reflection layer disposed between the display panel and the window.

12. An electronic apparatus comprising:

a display panel having a rear surface; and a heat dissipation layer disposed on the rear surface of the display panel, wherein the heat dissipation layer includes:

a base portion including an upper portion directly contacting the rear surface of the display panel and a lower portion disposed under the upper portion; and conductive particles spaced apart from the display panel with the upper portion interposed therebetween, the conductive particles are dispersed in the lower portion and are not dispersed in the upper portion, wherein the upper portion and the lower portion include a polymer resin of a same material and are integrally formed.

13. The electronic apparatus of claim 12, wherein a conductivity of a lower portion of the heat dissipation layer that includes the lower portion of the base portion is greater than a conductivity of an upper portion of the heat dissipation layer that includes the upper portion of the base portion.

14. The electronic apparatus of claim 12, further comprising an electronic module and a power source module disposed under the lower portion of the base portion.

15. The electronic apparatus of claim 12, wherein the conductive particles include copper and/or silver.

* * * * *